US012588229B2

(12) United States Patent
Lin et al.

(10) Patent No.: US 12,588,229 B2
(45) Date of Patent: Mar. 24, 2026

(54) GATE-TOP DIELECTRIC STRUCTURE FOR SELF-ALIGNED CONTACT

(71) Applicant: Taiwan Semiconductor Manufacturing Company, Ltd., Hsinchu (TW)

(72) Inventors: Ta-Chun Lin, Hsinchu (TW); Yi-Hsien Chen, Hsinchu County (TW); Wen-Cheng Luo, Taoyuan City (TW); Chung-Ting Li, Hsinchu County (TW); Yi-Shien Mor, Hsinchu (TW); Chih-Hao Chang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 523 days.

(21) Appl. No.: 18/150,900

(22) Filed: Jan. 6, 2023

(65) Prior Publication Data

US 2024/0014292 A1     Jan. 11, 2024

Related U.S. Application Data

(60) Provisional application No. 63/411,447, filed on Sep. 29, 2022, provisional application No. 63/392,545, (Continued)

(51) Int. Cl.
*H10D 30/01* (2025.01)
*H10D 30/43* (2025.01)
(Continued)

(52) U.S. Cl.
CPC ....... *H10D 30/0215* (2025.01); *H10D 30/014* (2025.01); *H10D 30/024* (2025.01); (Continued)

(58) Field of Classification Search
CPC ........... H10D 30/6735; H10D 30/6757; H10D 30/014; H10D 30/43; H10D 30/6219; (Continued)

(56) References Cited

U.S. PATENT DOCUMENTS

| | | |
|---|---|---|
| 11,257,926 B2 | 2/2022 | Yu |
| 11,387,331 B2 | 7/2022 | Fang |

(Continued)

FOREIGN PATENT DOCUMENTS

| | | |
|---|---|---|
| KR | 20210105801 A | 8/2021 |
| KR | 20220002214 A | 1/2022 |

(Continued)

*Primary Examiner* — Changhyun Yi
(74) *Attorney, Agent, or Firm* — HAYNES AND BOONE, LLP

(57) ABSTRACT

Semiconductor structures and methods of forming the same are provided. A semiconductor structure according to the present disclosure includes an active region having a channel region and a source/drain region, a gate structure over the channel region, a gate spacer layer disposed over the channel region and extending along a sidewall of the gate structure, an epitaxial source/drain feature over the source/drain region, a contact etch stop layer (CESL) disposed on the epitaxial source/drain feature and extending along a sidewall of the gate spacer layer, a source/drain contact disposed over the epitaxial source/drain feature, and a dielectric cap layer disposed over the gate structure, the gate spacer layer and at least a portion of the CESL. A sidewall of the source/drain contact is in direct contact with a sidewall of the CESL.

20 Claims, 29 Drawing Sheets

Related U.S. Application Data filed on Jul. 27, 2022, provisional application No. 63/359,279, filed on Jul. 8, 2022.

(51) Int. Cl.

| | | |
|---|---|---|
| *H10D 30/62* | (2025.01) | |
| *H10D 30/67* | (2025.01) | |
| *H10D 62/10* | (2025.01) | |
| *H10D 64/01* | (2025.01) | |

(52) U.S. Cl.

CPC ......... *H10D 30/43* (2025.01); *H10D 30/6211* (2025.01); *H10D 30/6219* (2025.01); *H10D 30/6735* (2025.01); *H10D 62/121* (2025.01); *H10D 64/017* (2025.01)

(58) Field of Classification Search

CPC ............. H10D 30/0215; H10D 30/024; H10D 64/017; H10D 62/121

See application file for complete search history.

(56) References Cited

U.S. PATENT DOCUMENTS

| | | | |
|---|---|---|---|
| 2022/0028983 A1 | 1/2022 | Fang | |
| 2022/0102527 A1 | 3/2022 | Hsieh | |
| 2022/0310811 A1* | 9/2022 | Min | ..................... H10D 84/038 |

FOREIGN PATENT DOCUMENTS

| | | | |
|---|---|---|---|
| KR | 20220043826 A | 4/2022 |
| TW | 202145443 A | 12/2021 |
| TW | 202209569 A | 3/2022 |
| TW | 202213643 A | 4/2022 |

* cited by examiner

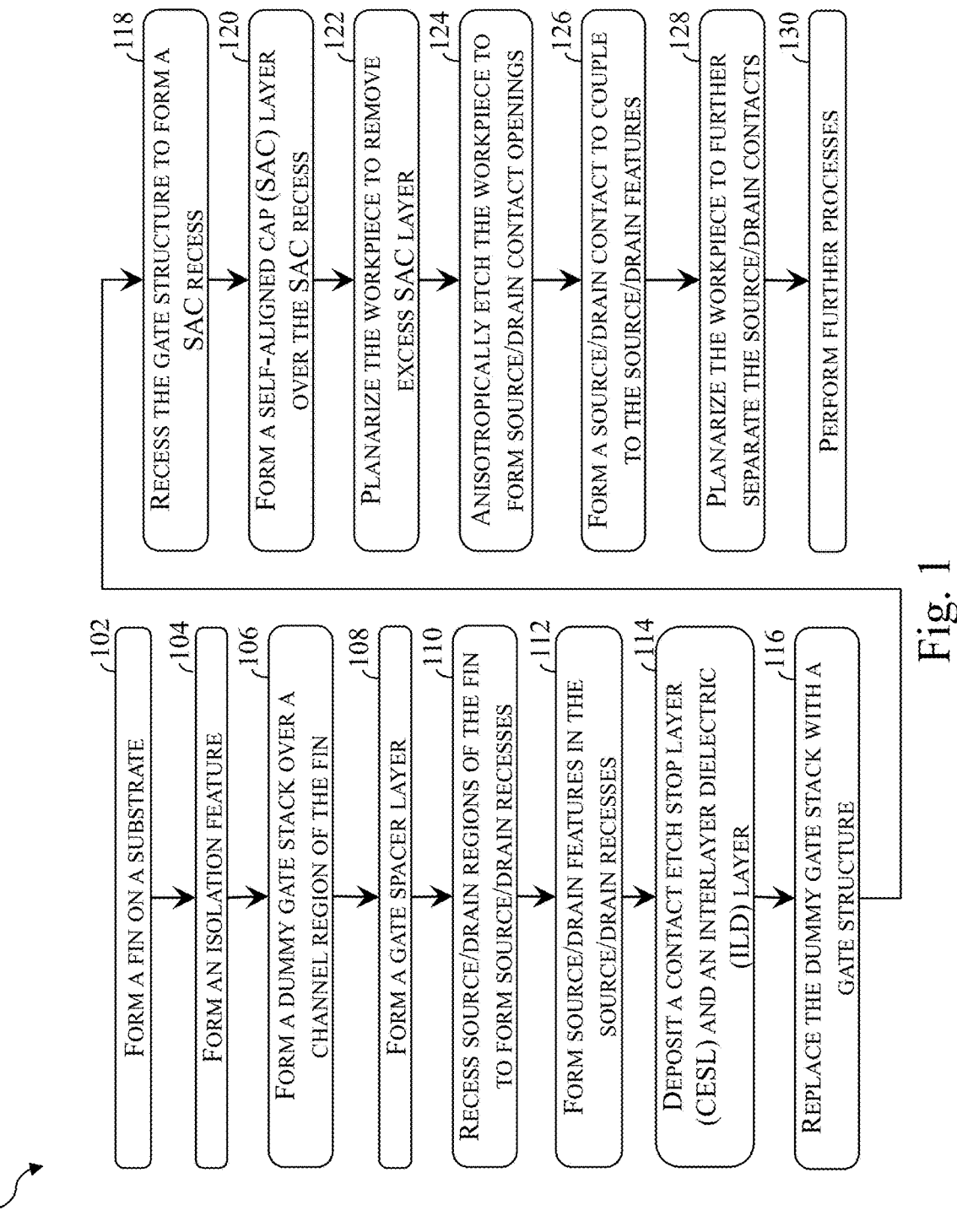

102 — FORM A FIN ON A SUBSTRATE

104 — FORM AN ISOLATION FEATURE

106 — FORM A DUMMY GATE STACK OVER A CHANNEL REGION OF THE FIN

108 — FORM A GATE SPACER LAYER

110 — RECESS SOURCE/DRAIN REGIONS OF THE FIN TO FORM SOURCE/DRAIN RECESSES

112 — FORM SOURCE/DRAIN FEATURES IN THE SOURCE/DRAIN RECESSES

114 — DEPOSIT A CONTACT ETCH STOP LAYER (CESL) AND AN INTERLAYER DIELECTRIC (ILD) LAYER

116 — REPLACE THE DUMMY GATE STACK WITH A GATE STRUCTURE

118 — RECESS THE GATE STRUCTURE TO FORM A SAC RECESS

120 — FORM A SELF-ALIGNED CAP (SAC) LAYER OVER THE SAC RECESS

122 — PLANARIZE THE WORKPIECE TO REMOVE EXCESS SAC LAYER

124 — ANISOTROPICALLY ETCH THE WORKPIECE TO FORM SOURCE/DRAIN CONTACT OPENINGS

126 — FORM A SOURCE/DRAIN CONTACT TO COUPLE TO THE SOURCE/DRAIN FEATURES

128 — PLANARIZE THE WORKPIECE TO FURTHER SEPARATE THE SOURCE/DRAIN CONTACTS

130 — PERFORM FURTHER PROCESSES

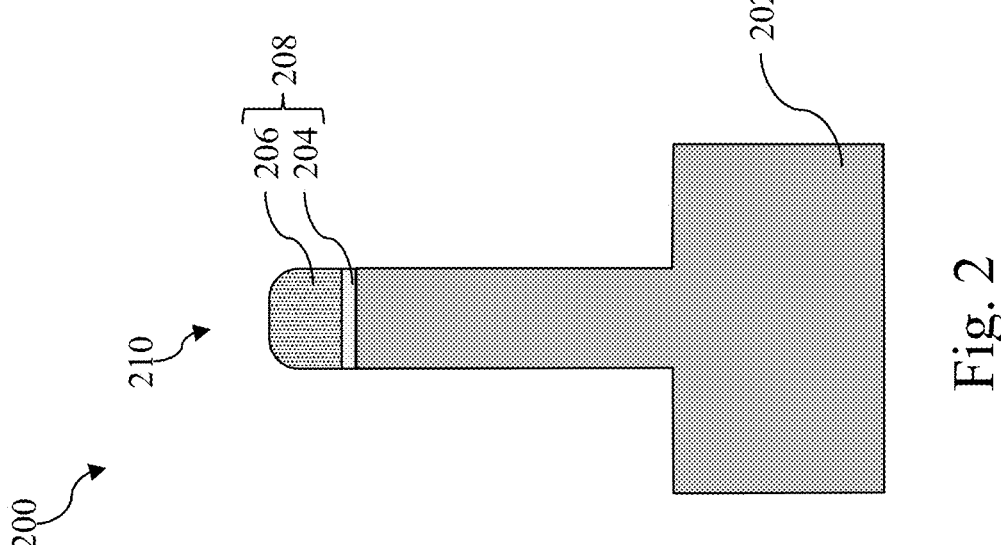
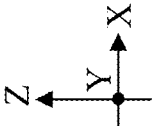
Fig. 2

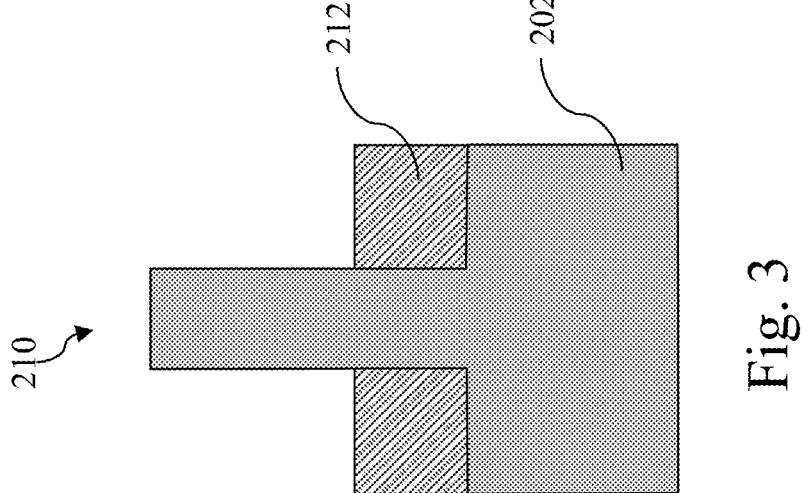
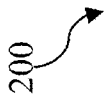
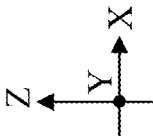
Fig. 3

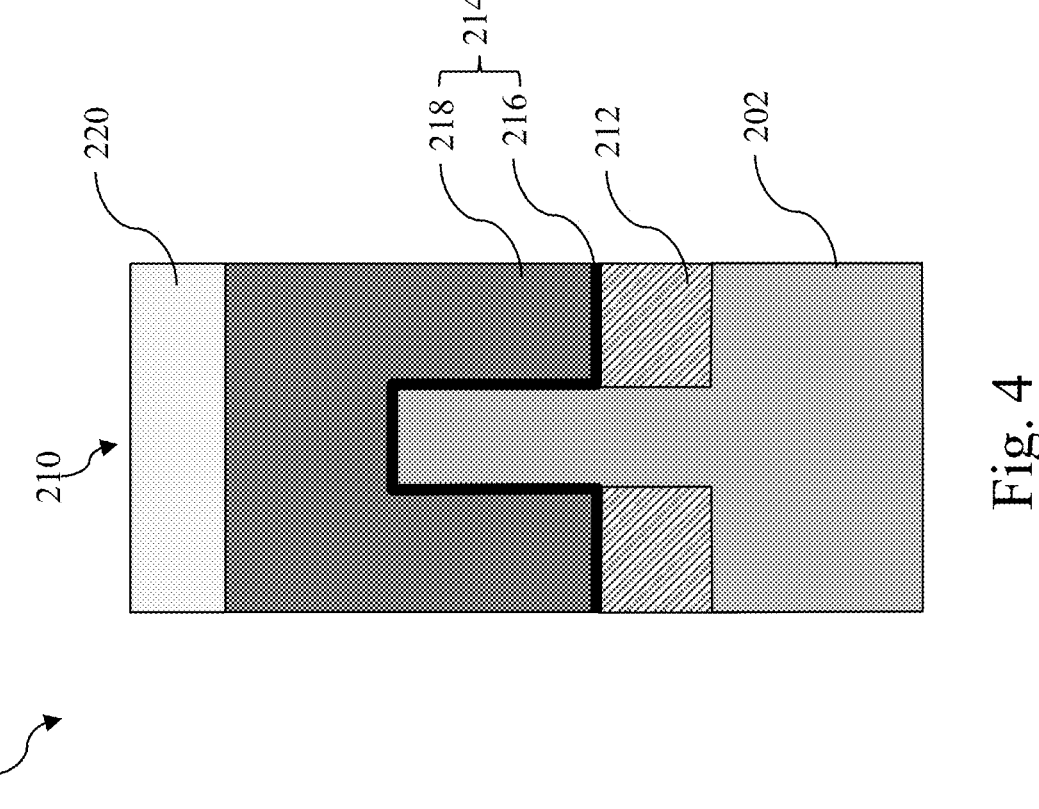
Fig. 4
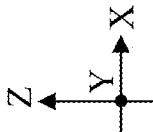

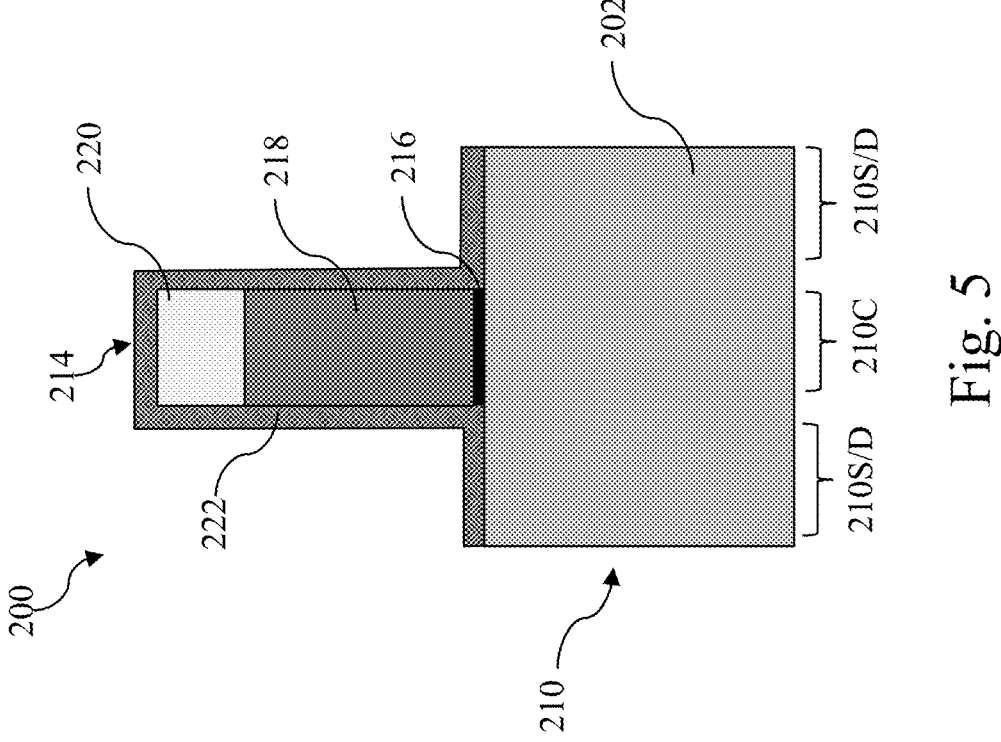
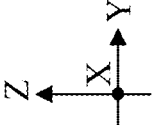
Fig. 5

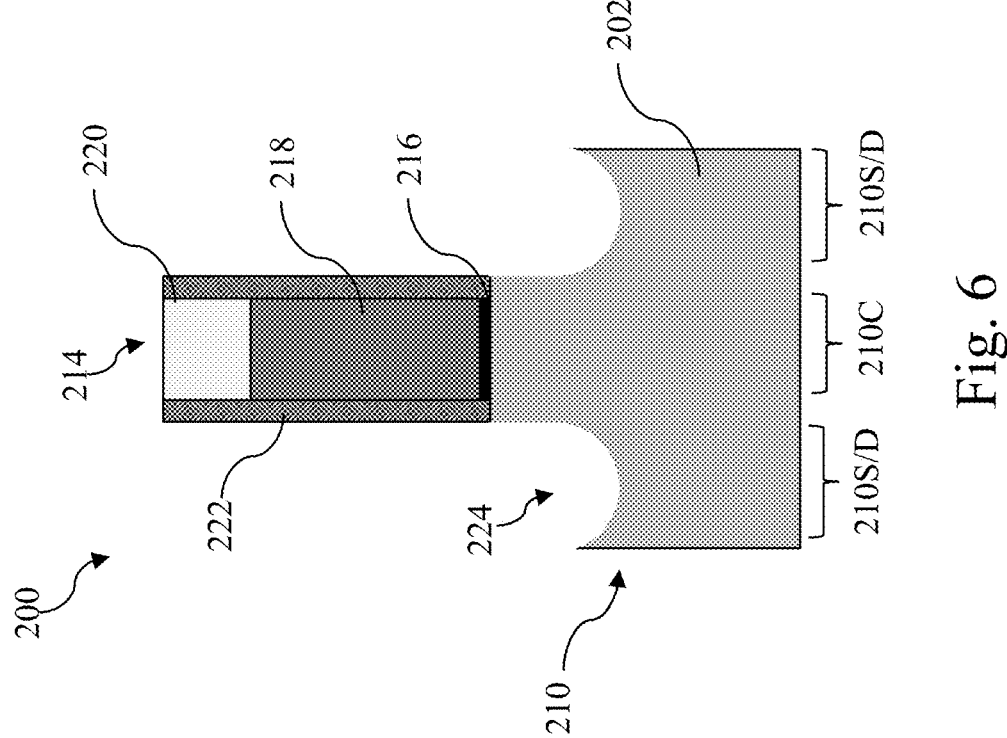
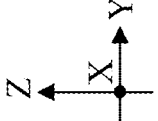
Fig. 6

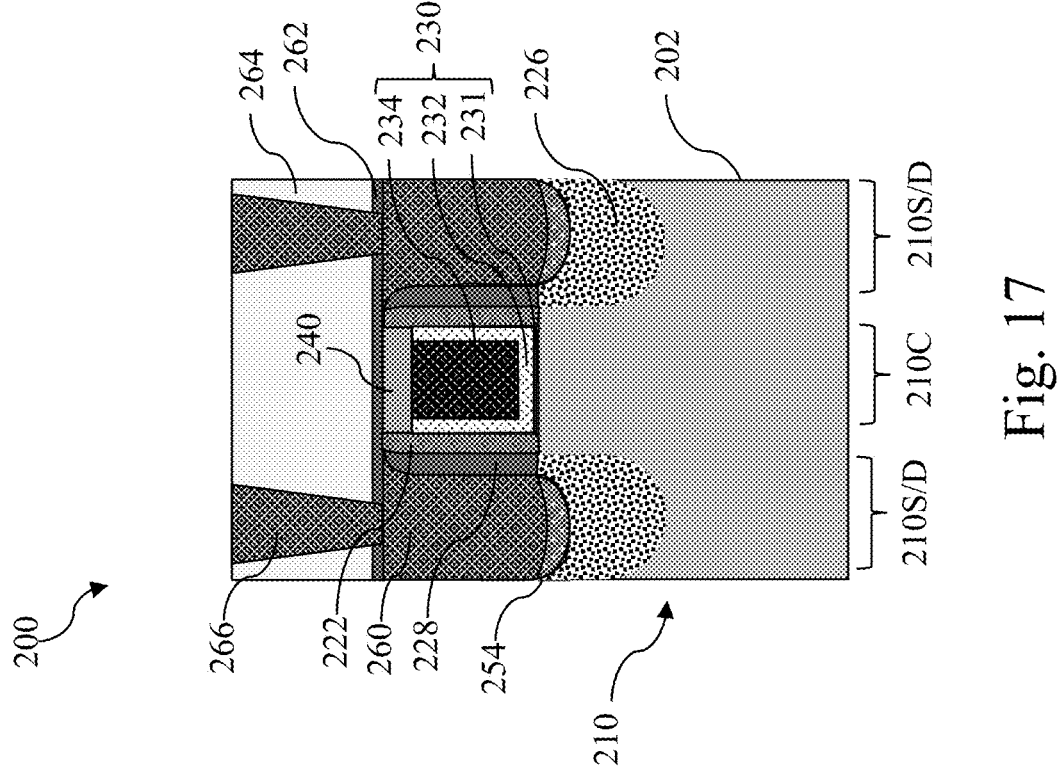
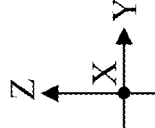
Fig. 17

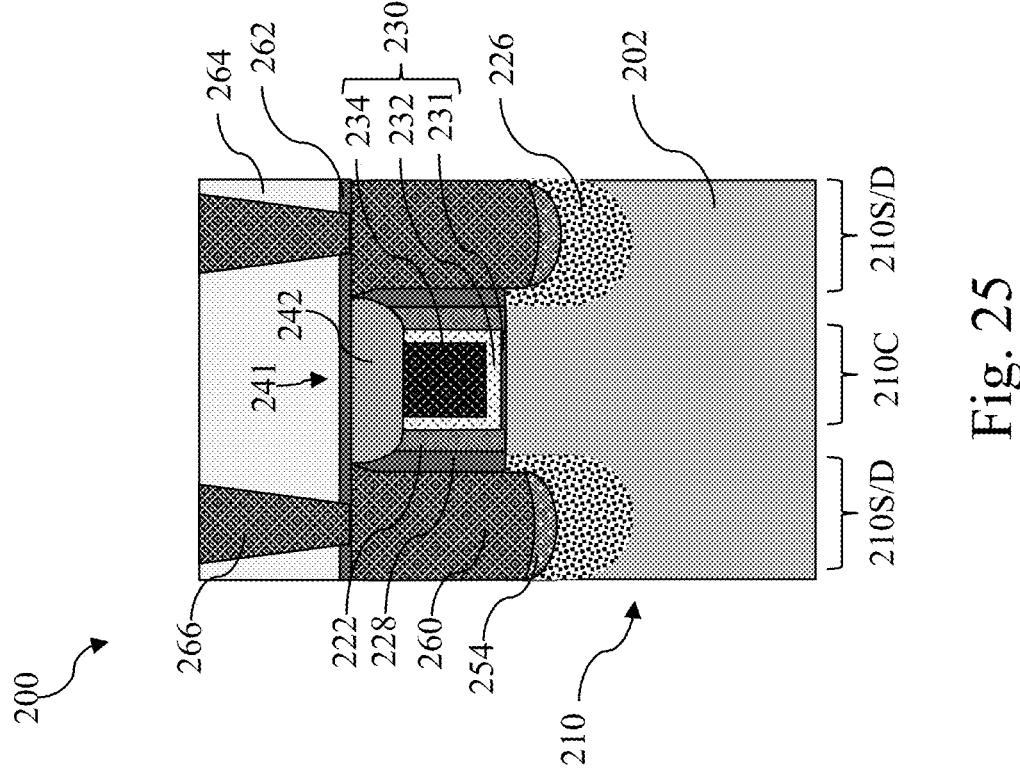
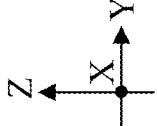
Fig. 25

GATE-TOP DIELECTRIC STRUCTURE FOR SELF-ALIGNED CONTACT

PRIORITY DATA

This application claims priority to U.S. Provisional Patent Application No. 63/411,447 filed on Sep. 29, 2022, U.S. Provisional Patent Application No. 63/392,545, filed on Jul. 27, 2022, and U.S. Provisional Patent Application No. 63/359,279 filed on Jul. 8, 2022, each of which are hereby incorporated herein by reference in their entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Self-aligned contact technology is helpful in forming contacts to ever-smaller multi-gate transistor structures. To allow for self-aligned formation of contact structures, self-aligned capping layers may be formed over a high-k metal gate structure of a multi-gate device. The formation of such self-aligned capping layers may include recessing gate structures to form a recess and depositing a capping dielectric layer in the recess. This process is not without challenges. In some technologies, the capping dielectric layer includes high-k dielectric material, which tends to increase the effective capacitance. In some technologies, the recess is defined in at least one gate spacer layers. Formation of source/drain contact openings may breach the at least one gate spacer layers to cause electrical shorts. While existing self-aligned contact formation processes are generally adequate to their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a flowchart of a method for fabricating a semiconductor device, according to various aspects of the present disclosure.

FIGS. 2-26 are fragmentary schematic cross-sectional views of a workpiece at various fabrication stages, such as those associated with the method in FIG. 1, according to various aspects of the present disclosure.

DETAILED DESCRIPTION

Figure 7:
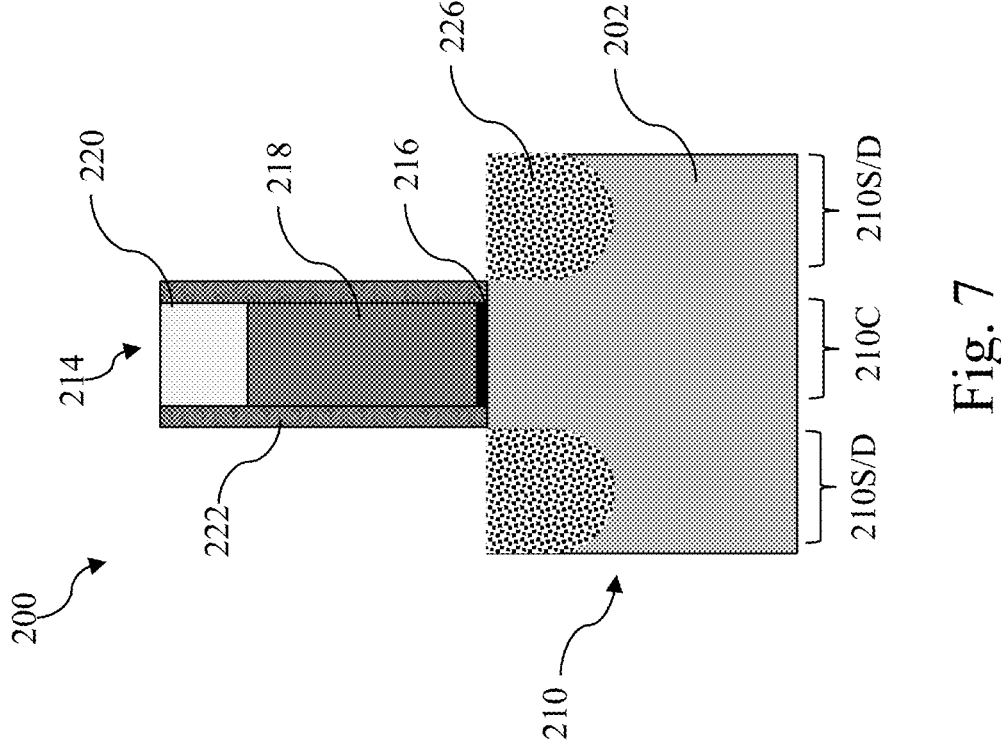

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +1-15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is related to a structure of or a process to form a multi-gate transistor. Particularly, the present disclosure is related to a self-aligned contact structure to source/drain features of a multi-gate transistor.

As integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Self-aligned contact technology is helpful in forming contacts to ever-smaller multi-gate transistor structures. To allow for self-aligned formation of contact structures, self-aligned capping layers may be formed over a high-k metal gate structure of a multi-gate device. The formation of such self-aligned capping layers may include recessing gate structures to form a recess and depositing a capping dielectric layer in the recess. The present disclosure provides improvements to the self-aligned contact structures to reduce parasitic capacitance and to increase yield. The high-k metal gate structure is defined between gate spacers and a contact etch stop layer (CESL) is deposited along sidewalls of the gate spacers. According to the present disclosure, the gate recess may also etch gate spacers and/or the CESL to make room for the capping dielectric layer. Instead of using high-k dielectric material having a dielectric constant greater than 10, the capping dielectric layer of the present disclosure is formed of a dielectric material having a dielectric constant between about 3.9 and about 10. Because a dielectric material having a low dielectric constant tends to be less etch resistant and a dielectric material having a high dielectric constant may contribute to high parasitic capacitance, the aforementioned dielectric constant range offers a unique balance. During the self-aligned formation of source/drain contact openings, top surfaces of the high-k metal gate structure, the gate spacers, and the CESL may become rounded. After formation of the source/drain contact in the source/drain contact openings, the structure is planarized such that top surfaces of the capping dielectric layer and the source/drain contact are coplanar.

The various aspects of the present disclosure will now be described in more detail with reference to the figures. FIG. 1 is a flowchart of a method 100 for fabricating a semiconductor device according to various aspects of the present disclosure. Method 100 is merely an example and is not intended to limit the present disclosure to what is explicitly illustrated in method 100. Additional steps can be provided before, during, and after method 100, and some of the steps described can be moved, replaced, or eliminated for additional embodiments of method 100. Not all steps are described herein in detail for reasons of simplicity. Method 100 will be described below in conjunction with the fragmentary cross-sectional views of a workpiece 200 shown in FIGS. 2-24. Because a semiconductor device will be formed from the workpiece 200, the workpiece 200 may be referred to as semiconductor device 200 as the context requires. Additionally, throughout the present disclosure, like reference numerals denote like features, unless otherwise described. It is noted that, while method 100 is described in conjunction with FIGS. 2-24, which illustrate formation of a FinFET, the present disclosure is not so limited. Method 100 and many aspects of the present disclosure may be applied to other types of multi-gate devices, such as MBC transistors.

Referring to FIGS. 1 and 2, method 100 includes a block 102 where a workpiece 200 that includes a fin 210 is provided. The workpiece 200 includes a substrate 202. In the depicted embodiment, substrate 202 is a bulk substrate that includes silicon (Si). Alternatively, in some implementations, substrate 202 includes a bulk substrate (including, for example, silicon) and one or more material layers disposed over the bulk substrate. For example, the one or more material layers can include a semiconductor layer stack having various semiconductor layers (such as a heterostructure) disposed over the bulk substrate, where the semiconductor layer stack is subsequently patterned to form fins. The semiconductor layers can include any suitable semiconductor materials, such as silicon (Si), germanium (Ge), silicon germanium (SiGe), other suitable semiconductor materials, or combinations thereof. The semiconductor layers can include same or different materials, etching rates, constituent atomic percentages, constituent weight percentages, thicknesses, and/or configurations depending on design requirements of the semiconductor device 200. Alternatively or additionally, the bulk substrate 202 and/or the one or more material layers include another elementary semiconductor, such as germanium (Ge); a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); other group III-V materials; other group II-V materials; or combinations thereof. Alternatively, substrate 202 is a semiconductor-on-insulator substrate, such as a silicon-on-insulator (SOI) substrate or a germanium-on-insulator (GeOI) substrate. Semiconductor-on-insulator substrates can be fabricated using separation by implantation of oxygen (SIMOX), wafer bonding, and/or other suitable methods.

As shown in FIG. 2, the workpiece 200 may include a plurality of fins 210 (only one is shown). In some embodiments, the plurality of fins 210 may be formed using one or more photolithography processes and one or more etching processes. In some implementations, the plurality of fins 210 may be formed using a single patterning process or a multiple-patterning process. Examples of multiple-patterning processes include a double patterning lithography (DPL) process (for example, a lithography-etch-lithography-etch (LELE) process, a self-aligned double patterning (SADP) process, a spacer-is-dielectric patterning (SIDP) process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. To form the plurality of fins 210, a fin top hard mask layer 208 is deposited over the substrate 202 and then patterned to form a patterned fin top hard mask layer 208. The patterned fin-top hard mask layer 208 is then applied as an etch mask to etch the substrate 202 (or a semiconductor layer stack thereon) to form the plurality of fins 210. The fin top hard mask layer 208 may be a single layer or a multi-layer. FIG. 2 illustrates a multi-layer fin top hard mask layer 208 that includes a first fin top layer 204 and a second fin top layer 206. In some instances, the first fin top layer 204 may be formed of silicon nitride, silicon oxynitride, silicon carbonitride, or other suitable material and the second fin top layer 206 may be formed of silicon oxide or other suitable dielectric material. The first fin top layer 204 and the second fin top layer 206 may be deposited using chemical vapor deposition (CVD), atomic layer deposition (ALD), or other suitable method. In FIG. 2, each of the fins 210 extends lengthwise along the Y direction and rises from the substrate 202 along the Z direction. The fin top hard mask layer 208 may be rounded as a result of the formation processes for the fins 210.

Referring to FIGS. 1 and 3, method 100 includes a block 104 where an isolation feature 212 is formed. To isolate the plurality of fins 210 from one another, the isolation feature 212 is deposited over the workpiece 200, including over the plurality of fins 210 as well as the fin top hard mask layer 208. In some embodiments, the isolation feature 212 may be a shallow trench isolation (STI) layer formed of a dielectric material that is deposited using flowable chemical vapor deposition (FCVD), spin-on coating, CVD, or other suitable method. Such dielectric material may include silicon oxide, silicon oxynitride, fluorine-doped silicate glass (FSG), a low-k dielectric, combinations thereof, and/or other suitable materials. In some embodiments, an anneal process or an ultraviolet (UV) curing process may be performed to cure the deposited dielectric material. The deposited dielectric material is planarized by using, for example, a chemical mechanical polishing (CMP), which may remove the fin top hard mask layer 208. Then the planarized dielectric material is etched back to form the isolation feature 212 such that the fins 210 rise above the isolation feature 212, as shown in FIG. 3.

Referring to FIGS. 1, 4 and 5, method 100 includes a block 106 where a dummy gate stack 214 is formed over a channel region 210C of the fin 210. In some embodiments, a gate replacement process (or gate-last process) is adopted where the dummy gate stack 214 serves as a placeholder to undergo various processes and is to be removed and replaced by the functional gate structure, such as the gate structure 230 to be described further below. Other processes and configuration are possible. In some embodiments illustrated in FIG. 5, the dummy gate stack 214 is formed over a fin 210 and the fin 210 may be divided into a channel region 210C underlying the dummy gate stacks 214 and source/drain regions 210SD that do not underlie the dummy gate stacks 214. The channel region 210C of the fin 210 is adjacent the source/drain regions 210SD. The channel region 210C is disposed between two source/drain regions 210SD along the Y direction. As shown in FIGS. 4 and 5, the dummy gate stack 214 may include a dummy dielectric layer 216 and a dummy electrode layer 218. In some embodiments, the dummy dielectric layer 216 may include silicon oxide and the dummy electrode layer 218 may include polysilicon (poly Si). The dummy dielectric layer 216 may be formed on the fin 210 using a chemical vapor deposition (CVD) process, an ALD process, an oxygen plasma oxidation process, a thermal oxidation process, or other suitable processes. The dummy electrode layer 218 may be deposited over the dummy dielectric layer 216 using a CVD process, an ALD process, or other suitable processes. To pattern the dummy dielectric layer 216 and the dummy electrode layer 218 into the dummy gate stack 214, the gate-top hard mask layer 220 may be deposited on the dummy electrode layer 218 using a CVD process, an ALD process, or other suitable processes. Although not explicitly shown in FIG. 5, the gate top hard mask layer 220 may be a multi-layer and may include a silicon nitride layer and a silicon oxide layer over the silicon nitride layer. In other embodiments, the gate top hard mask layer 220 may include a silicon oxide layer and a silicon nitride layer over the silicon oxide layer. The gate-top hard mask layer 220 is then patterned to serve as an etch mask to etch the dummy electrode layer 218 and the dummy dielectric layer 216 to form the dummy gate stack 214, as shown in FIG. 5.

Referring to FIGS. 1 and 5, method 100 includes a block 108 where at least one gate spacer layer 222 is formed. Subsequent to the formation of the dummy gate stack 214, the at least one gate spacer layer 222 is deposited over the dummy gate stack 214, the gate-top hard mask layer 220 as well as source/drain regions 210SD of the fin 210. In some embodiments, the at least one gate spacer layer 222 may be deposited using ALD, CVD, or other suitable methods. In some embodiments, to reduce parasitic capacitance between the subsequently formed gate structure and adjacent source/drain features, the at least one gate spacer 222 is formed of a dielectric material having a dielectric constant closer to that of silicon oxide, which is about 3.9. In some embodiments, the at least one gate spacer 222 includes silicon oxycarbide (SiOC) or silicon oxycarbonitride (SiCON).

Referring to FIGS. 1 and 6, method 100 includes a block 110 where source/drain regions 210SD of the fin 210 are recessed to form source/drain recesses 224. In some embodiments, the source/drain regions 210SD are anisotropically etched by a dry etch or a suitable etching process to form the source/drain recesses 224. For example, the dry etch process may implement oxygen ($O_2$), an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIG. 6, after the formation of the source/drain recesses 224, the at least one gate spacer layer 222 may remain disposed along sidewalls of the dummy gate stack 214.

Referring to FIGS. 1 and 7, method 100 includes a block 112 where source/drain features 226 are formed in the source/drain recesses 224. The source/drain features 226 may be epitaxially and selectively formed from surfaces of the source/drain recesses 224. Suitable epitaxial processes for block 112 include vapor-phase epitaxy (VPE), ultra-high vacuum CVD (UHV-CVD), molecular beam epitaxy (MBE), and/or other suitable processes. The epitaxial growth process at block 112 may use gaseous precursors, which interact with the composition of the substrate 202 and the fin 210. Depending on the conductivity type of the semiconductor device 200, the source/drain feature 226 may have different compositions. When the semiconductor device 200 is n-type, the source/drain features 226 may include silicon (Si) and may be doped with an n-type dopant, such as phosphorus (P) or arsenic (As). When the semiconductor device 200 is p-type, the source/drain features 226 may include silicon germanium (SiGe) and is doped with a p-type dopant, such as boron (B), boron difluoride ($BF_2$), or gallium (Ga). While not explicitly shown in FIG. 7, the source/drain feature 226 may include two or more epitaxial layers. For example, each of the source/drain features 226 may include a first epitaxial layer, a second epitaxial layer, and a third epitaxial layer that are doped with the same type of dopant but at different doping concentrations to reduce defect density and contact resistance. In one embodiment, the source/drain feature 226 may include phosphorus-doped silicon (Si:P) when n-type semiconductor devices are desired and may include boron-doped silicon germanium (SiGe:B) when p-type semiconductor devices are desired.

Figure 8:
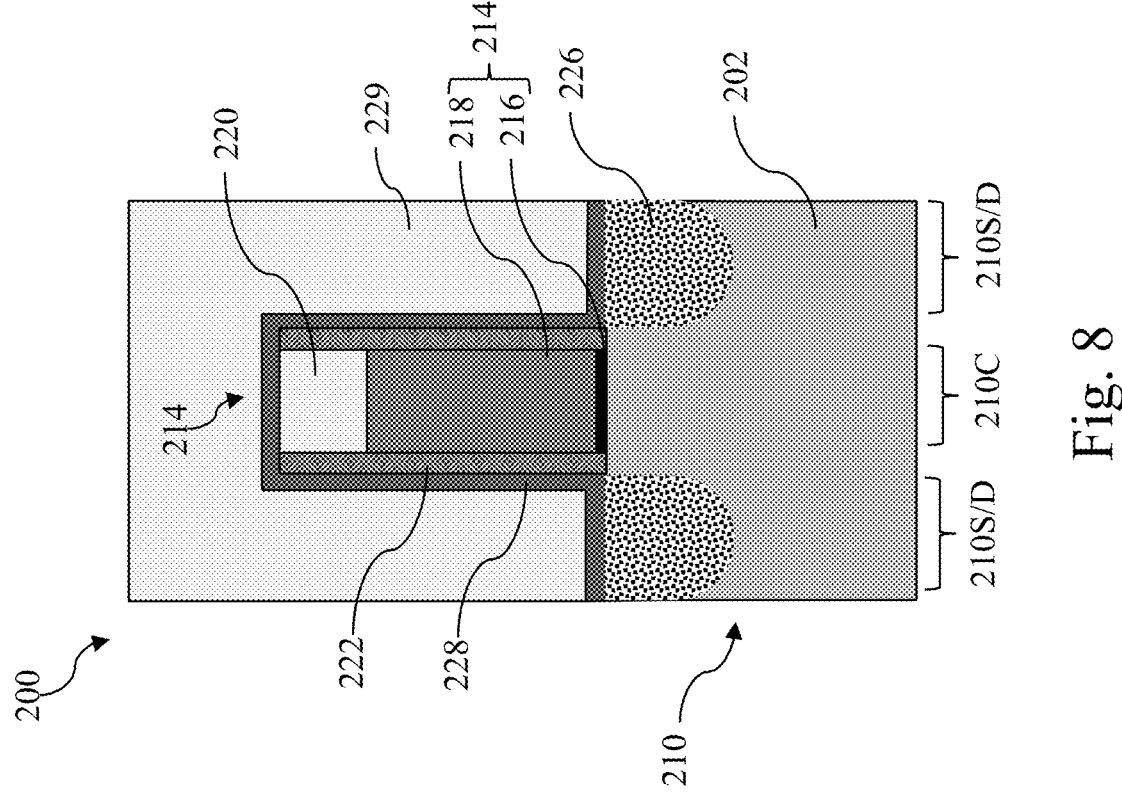
Figure 9:
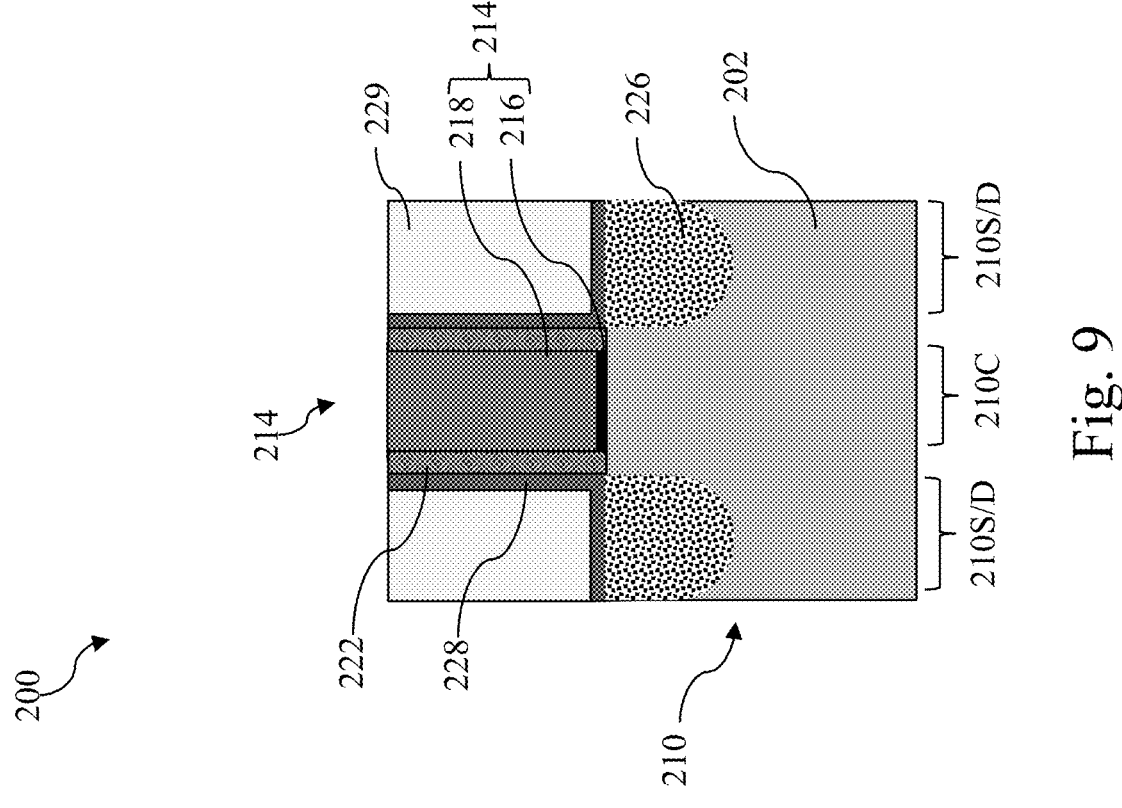

Referring to FIGS. 1, 8 and 9, method 100 includes a block 114 where a contact etch stop layer (CESL) 228 and an interlayer dielectric (ILD) layer 229 are deposited. As shown in FIG. 8, the CESL 228 is formed prior to forming the ILD layer 229. In some examples, the CESL 228 includes silicon nitride, silicon oxynitride, and/or other materials known in the art. The CESL 228 may be formed by ALD, plasma-enhanced chemical vapor deposition (PECVD) process and/or other suitable deposition processes. The ILD layer 229 is then deposited over the CESL 228. In some embodiments, the ILD layer 229 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 229 may be deposited by a PECVD process or other suitable deposition technique. In some embodiments, after formation of the ILD layer 229, the workpiece 200 may be annealed to improve integrity of the ILD layer 229. In some alternative embodiments, the composition and formation of the CESL 228 may be similar to that of the at least one gate spacer layer 222. Reference is now made to FIG. 9. After the deposition of the ILD layer 229, the workpiece 200 is planarized until the gate-top hard mask layer 220 is completely removed and top surfaces of the ILD layer 229, the CESL 228, the at least one gate spacer layer 222, and the dummy gate stack 214 are coplanar. In other words, the dummy electrode layer 218 is exposed after the planarization at block 114.

Figure 10:
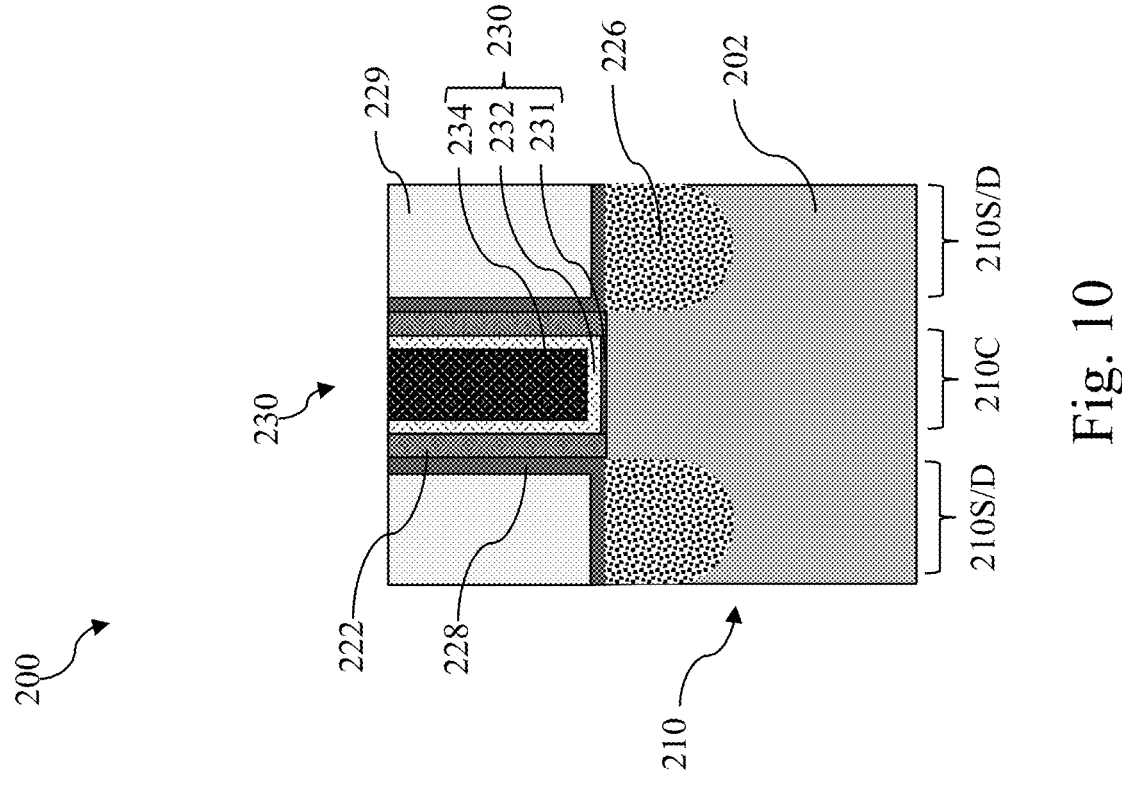

Referring to FIGS. 1 and 10, method 100 includes a block 116 where the dummy gate stack 214 is replaced with a gate structure 230. Operations at block 116 include removal of the dummy gate stack 214 and formation of the gate structure 230 to wrap over the channel region 210C of the fin 210. Referring to FIG. 10, the dummy gate stack 214 exposed at the conclusion of block 114 is removed from the workpiece 200 by a selective etch process. The selective etch process may be a selective wet etch process, a selective dry etch process, or a combination thereof. In the depicted embodiments, the selective etch process selectively removes the dummy dielectric layer 216 and the dummy electrode layer 218 without substantially damaging the at least one gate spacer layer 222, the ILD layer 229, and CESL 228. The removal of the dummy gate stack 214 results in a gate trench over the channel region 210C. After the removal of the dummy gate stack 214, the gate structure 230 is then deposited over the workpiece 200 to wrap over the channel region 210C of the fin 210. The gate structure 230 may include an interfacial layer 231 on the channel region 210C, a gate dielectric layer 232 on the interfacial layer 231 and a gate electrode layer 234 over the gate dielectric layer 232. As used herein, high-k dielectric materials include dielectric materials having a high dielectric constant, for example, greater than that of thermal silicon oxide (~3.9). In some embodiments, the interfacial layer 231 includes silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel region 210C to form the interfacial layer 231. The gate dielectric layer 232 is then deposited over the interfacial layer 231 using ALD, CVD, and/or other suitable methods. In one embodiment, the gate dielectric layer 232 may include hafnium oxide. Alternatively, the gate dielectric layer 232 may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. After the formation or deposition of the gate dielectric layer 232, the gate electrode layer 234 is deposited over the gate dielectric layer 232.

The gate electrode layer 234 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 234 may be formed by ALD, PVD, CVD, e-beam evaporation, or other suitable process. A planarization process, such as a CMP process, may be performed to remove excess materials and provide a planar top surface.

Figure 11:
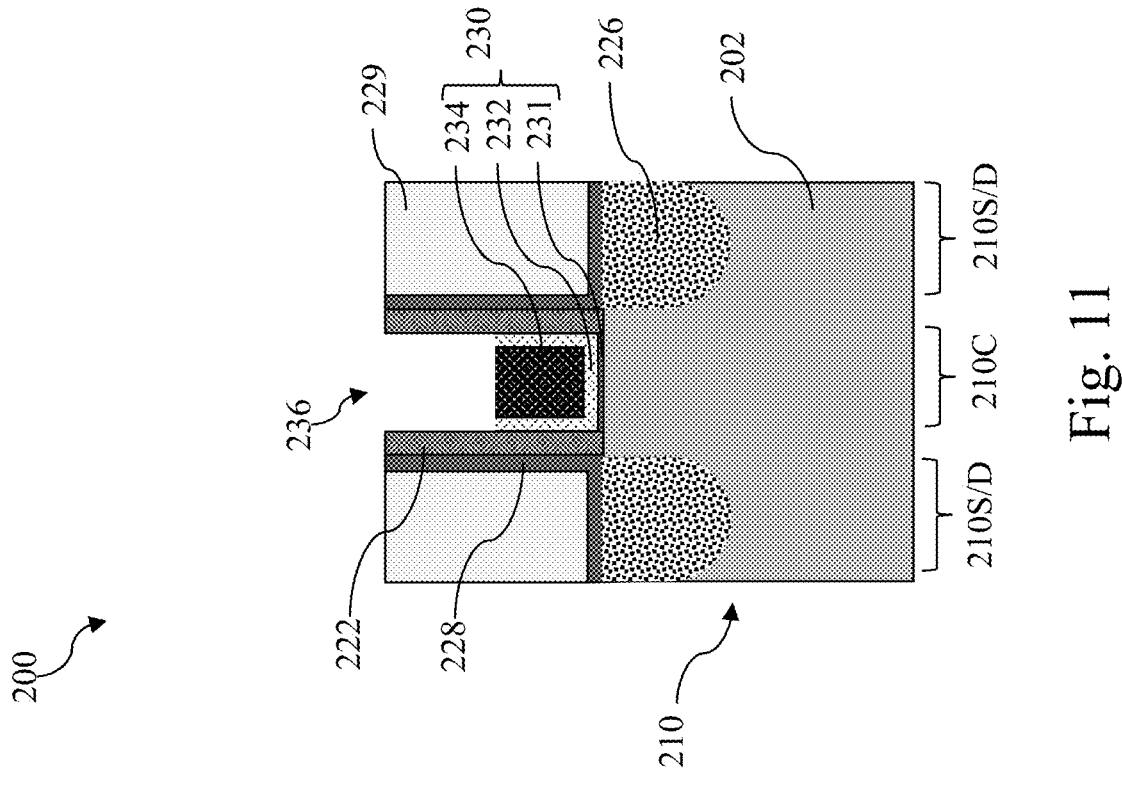

Referring to FIGS. 1 and 11, method 100 includes a block 118 where the gate structures 230 are recessed to form a gate recess 236. In some embodiments, the recessing at block 118 may include a first etch process to selectively recess the at least one work function layer in the gate electrode layer 234 and a second etch process to selectively recess the gate dielectric layer 232. The second etch process is performed after the first etch process. In some implementations, the first etch process is a dry etch process that includes use of plasma of hydrogen bromide (HBr), chlorine ($Cl_2$), oxygen ($O_2$), or a mixture thereof. In some alternative embodiments, the first etch process may be a wet etch process or an atomic layer etching (ALE) process. The second etch process may be a dry etch process that includes use of plasma of oxygen ($O_2$), an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$). In some alternative embodiment, the second etch process may be a wet etch process or an ALE process. In the embodiments depicted in FIG. 11, the recessing at block 118 does not substantially etch the at least one gate spacer layer 222, the CESL 228, or the ILD 229. As a result, the gate recess 236 shown in FIG. 11 is defined between two portions of the at least one gate spacer layer 222 along the Y direction. The gate recess 236 may also be referred to as a self-aligned cap (SAC) recess 236. As shown in FIG. 11, because the at least one gate spacer layer 222 is not substantially recessed, the gate recess 236 and the gate structure 230 may have the same width along the Y direction.

Figure 12:
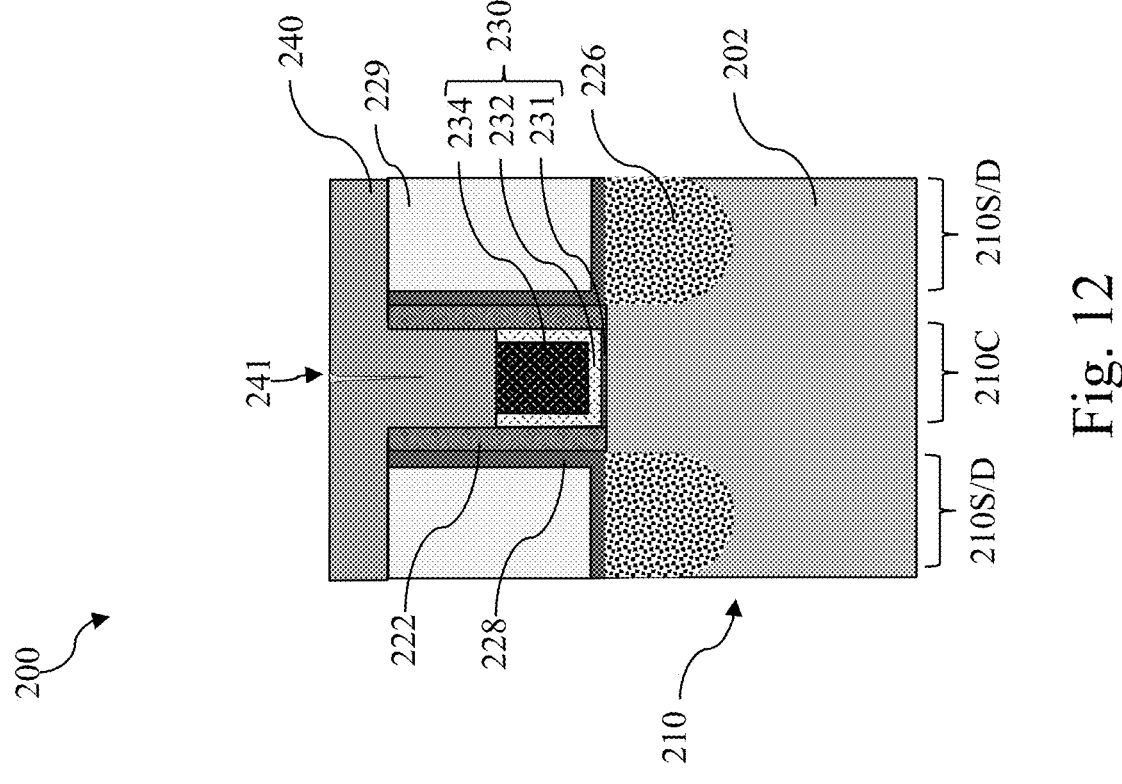

Referring to FIGS. 1 and 12, method 100 includes a block 120 where a capping dielectric layer 240 is formed over the gate structure 230. In some embodiments, the capping dielectric layer 240 is deposited over the SAC recess 236 by chemical vapor deposition (CVD), plasma-enhanced CVD (PECVD), or a suitable deposition process. To balance the need for sufficient etch resistance and reduction of parasitic capacitance, the capping dielectric layer 240 has a dielectric constant between about 3.9 and about 10. In this regard, 3.9 is about the dielectric constant of silicon dioxide and 10 is about the dielectric constant of aluminum oxide. In some instances, the capping dielectric layer 240 may include silicon oxide, silicon nitride, silicon carbide, silicon carbonitride, silicon oxynitride, silicon oxycarbonitride, aluminum oxide, aluminum nitride, or aluminum oxynitride. In one embodiment, the capping dielectric layer 240 includes silicon nitride. In general, the capping dielectric layer 240 does not include dielectric materials usually found in the gate dielectric layer 232, such as hafnium oxide, zirconium oxide, lanthanum oxide, or titanium oxide. In some embodiments represented in FIG. 12, the deposition of the capping dielectric layer 240 may be of a conformal nature such that a middle seam 241 (or middle void) is formed in the capping dielectric layer 240 directly over the gate structure 230.

Figure 13:
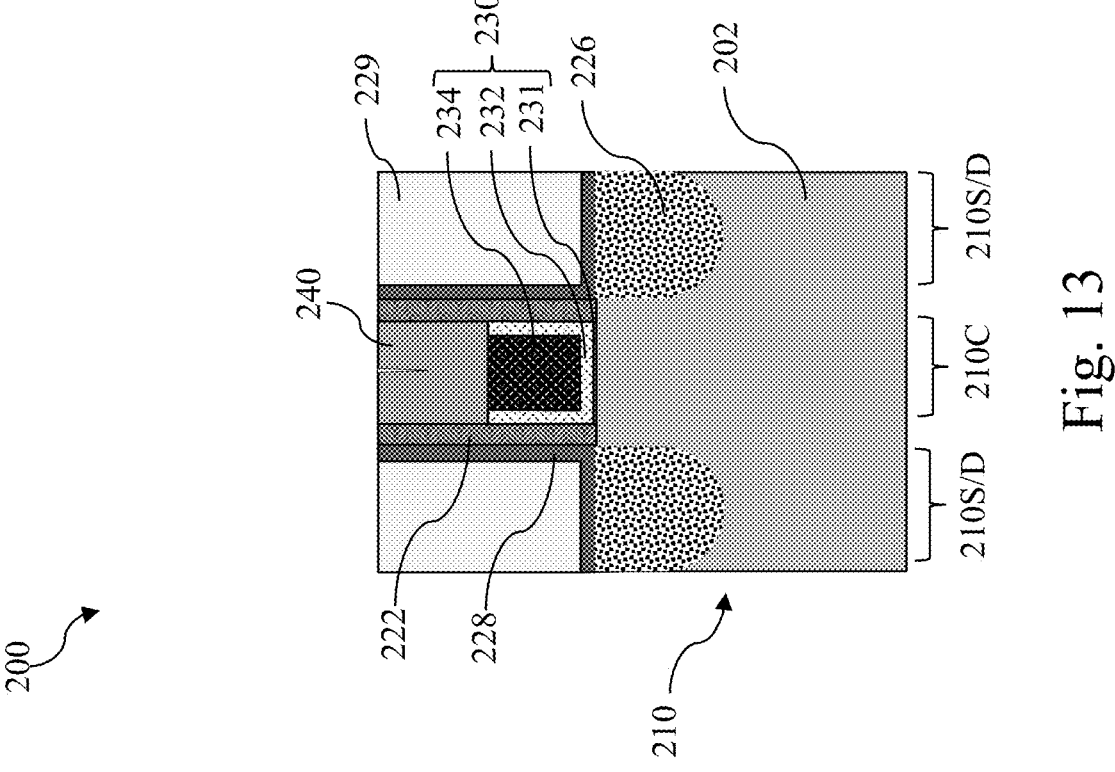

Referring to FIGS. 1 and 13, method 100 includes a block 122 wherein the workpiece 200 is planarized to remove excess capping dielectric layer 240. After the deposition of the capping dielectric layer 240, a planarization process, such as a CMP process, may be performed to remove excess dielectric material over the ILD layer 229, thereby forming a dielectric cap 240 (for ease of illustration and continuity, the same reference numeral 240 is used to denote both the capping dielectric layer and the dielectric cap as the latter is formed from the former) directly over the gate structure 230. In the depicted embodiment, sidewalls of the dielectric cap 240 are in direct contact with the at least one gate spacer layer 222 and a bottom surface of the dielectric cap 240 is in direct contact with top surfaces of the gate dielectric layer 232 and the gate electrode layer 234.

Figure 14:
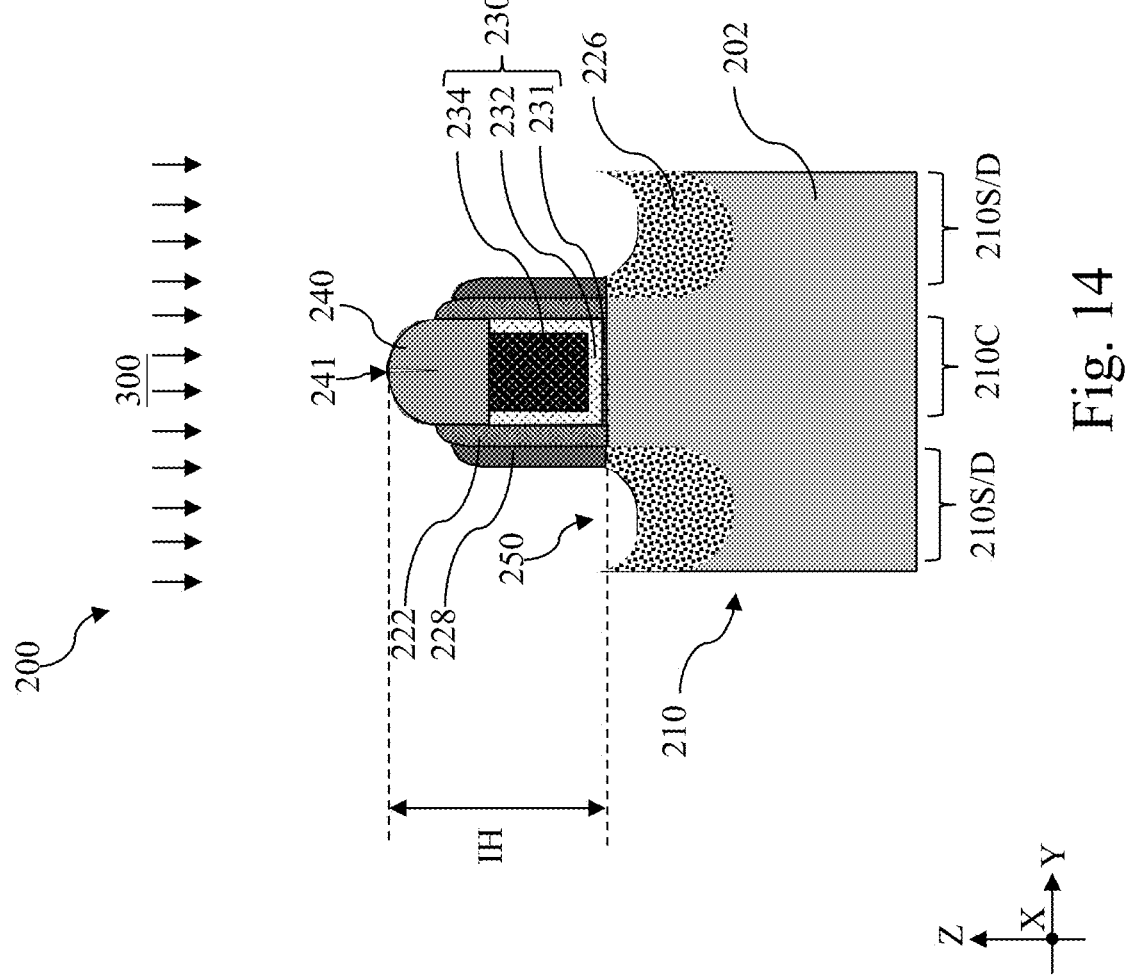

Referring still to FIGS. 1 and 14, method 100 includes a block 124 where the workpiece 200 is anisotropically etched to form source/drain contact openings 250. Photolithography techniques are not used for operations at block 124. In other words, no photo mask is used at block 124. At block 124, an anisotropic etch process 300 is performed to the workpiece 200 to form source/drain contact openings 250 through the ILD layer 229 and the CESL 228. To ensure that the CESL 228 is etched through, the source/drain contact openings 250 may partially extend into the source/drain features 226, as shown in FIG. 14. The anisotropic etching at block 124 may round corners of the dielectric cap 240, the at least one gate spacer layer 222 and the CESL 228. That is, after the operations at block 124, the dielectric cap 240, the at least one gate spacer layer 222 and the CESL 228 all have rounded corners. When the dielectric cap 240 is formed of more etch resistant dielectric materials, such as aluminum oxide, aluminum nitride, or aluminum oxynitride, the remaining dielectric cap 240 may have an intermediate height (IH) greater than heights of the at least one gate spacer layer 222 and the CESL 228, as measured from a top surface of the fin 210 in the channel region 210C. It is also noted that at this stage, the middle seam 241 may still be present in the dielectric cap 240.

Figure 15:
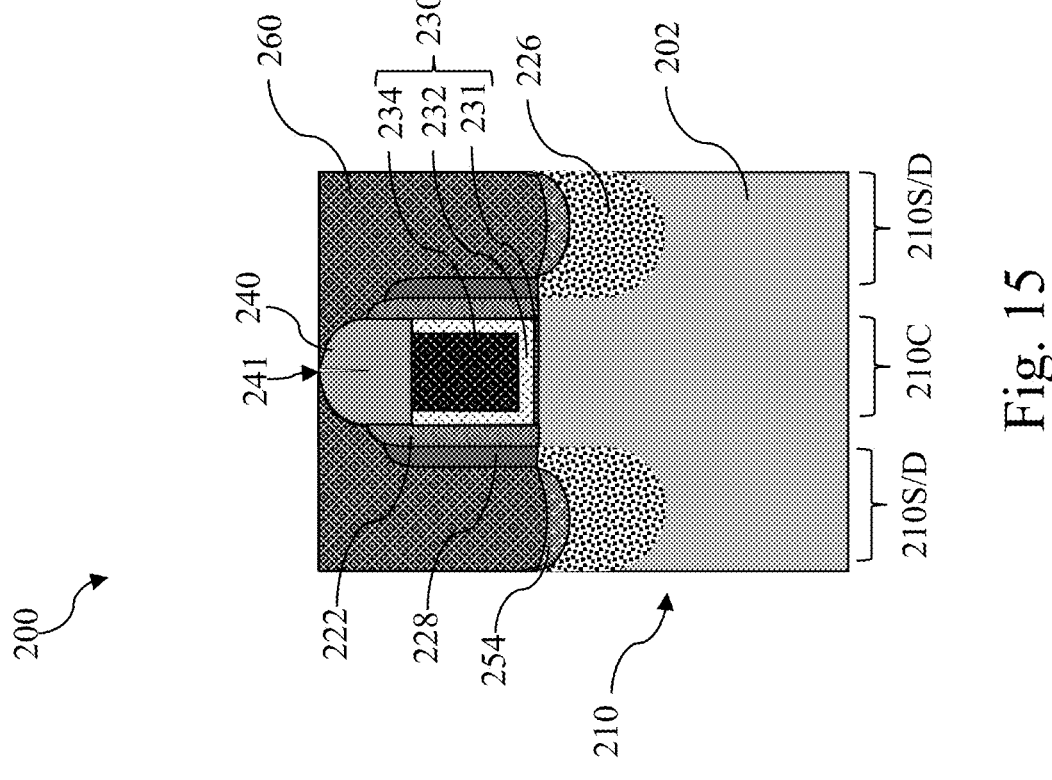

Referring still to FIGS. 1 and 15, method 100 includes a block 126 where source/drain contacts 260 are formed to couple to the source/drain feature 226. At block 126, the source/drain contacts 260 are formed in the source/drain contact openings 250. In the depicted embodiments, in order to reduce contact resistance, a silicide layer 254 may be formed on the exposed surfaces of the source/drain features 226 by depositing a metal precursor layer over the source/drain features 226 and performing an anneal process to bring about silicidation between the metal precursor layer and the source/drain features 226. Suitable metal precursor layer may include titanium (Ti), tantalum (Ta), nickel (Ni), cobalt (Co), or tungsten (W). The silicide layer 254 may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer 254, a metal fill layer may be deposited into the contact openings to form the source/drain contacts 260. The metal fill layer may include titanium nitride (TiN), titanium (Ti), ruthenium (Ru), nickel (Ni), cobalt (Co), copper (Cu), molybdenum (Mo), tungsten (W), tantalum (Ta), or tantalum nitride (TaN). In one embodiment, the source/drain contacts 260 include cobalt (Co). As shown in FIG. 15, the silicide layer 254 is disposed between the source/drain features 226 and the source/drain contacts 260. Before the subsequent planarization at block 126, the source/drain contacts 260 formed at block 126 track the shapes of the CESL 228, the at least one gate spacer layer 222, and the dielectric cap 240, including the rounded corners described above. In the depicted embodiments, sidewalls of the source/drain contacts 260 are in direct contact with the CESL 228, the at least one gate spacer layer 222 and the dielectric cap 240.

Figure 16:
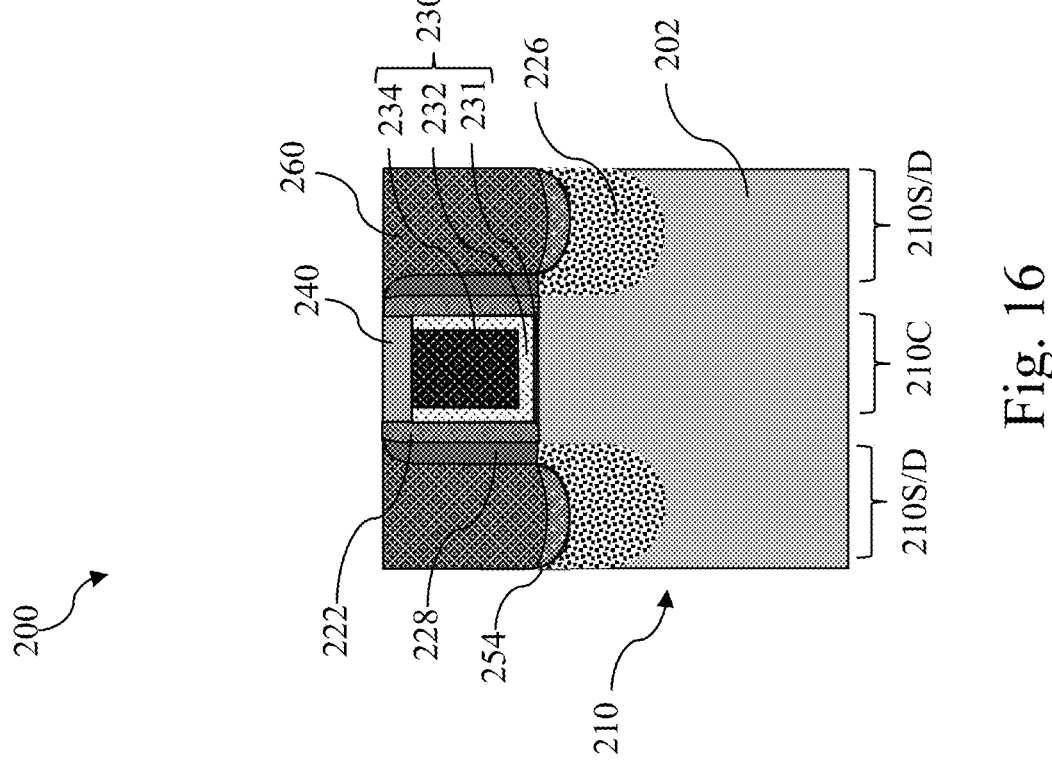

Referring still to FIGS. 1 and 16, method 100 includes a block 128 where the workpiece 200 is planarized to remove the excess source/drain contact 260. A planarization process may follow the operations at block 126 to remove excess materials, thereby forming the source/drain contacts 260 shown in FIG. 16. For ease of reference, the reference numeral 260 is used to denote both the pre-planarization source/drain contacts 260 as well as the post-planarization source/drain contacts 260. It is noted that the source/drain contacts 260 at block 126 may merge over the dielectric cap 240 while the source/drain contacts 260 at block 128 are electrically isolated from each other as they no longer merge over the gate structure 230. Due to the planarization process, top surfaces of the source/drain contacts 260, the dielectric cap 240, the at least one gate spacer layer 222, and the CESL 228 are coplanar. Depending on the process conditions, the middle seam 241 (shown in FIGS. 14 and 15) may be removed from the dielectric cap 240, as representatively shown in FIG. 16. In some alternative implementations, the middle seam 241 may remain in the dielectric cap 240. In some embodiments represented in FIG. 16, the planarization at block 128 does not completely remove the rounded corners of the CESL 228. As a result, a top portion of the source/drain contacts 260 may track the shapes of the rounded corners of the CESL 228. In other words, a top portion of the source/drain contacts 260 may slightly span over or overhang the CESL 228. As shown in FIG. 16, a bottom surface of the dielectric cap 240 is in contact with top surfaces of the gate dielectric layer 232 and the gate electrode 234 while sidewalls of the dielectric cap 240 are in contact with the at least one gate spacer layer 222.

Referring to FIGS. 1 and 17, method 100 includes a block 130 where further processes are performed. For example, contact structures may be formed to electrically couple to the source/drain contacts 260. In some embodiments represented in FIG. 17, contact vias 266 may be formed to electrically couple to the source/drain contacts. In an example process, an etch stop layer (ESL) 262 and a top ILD layer 264 are sequentially deposited over the workpiece 200. In some implementations, a composition of the ESL 262 may be similar to that of the CESL 228 and a composition of the top ILD layer 264 may be similar to the ILD layer 229. Contact via openings are then formed through the top ILD layer 264 and the ESL 262 to expose the source/drain contacts 266. A barrier layer (not shown) and a metal fill layer are deposited over the contact via openings to form the contact vias 266. In some instances, the barrier layer may include titanium nitride (TiN) and the metal fill layer includes copper (Cu).

Figure 18:
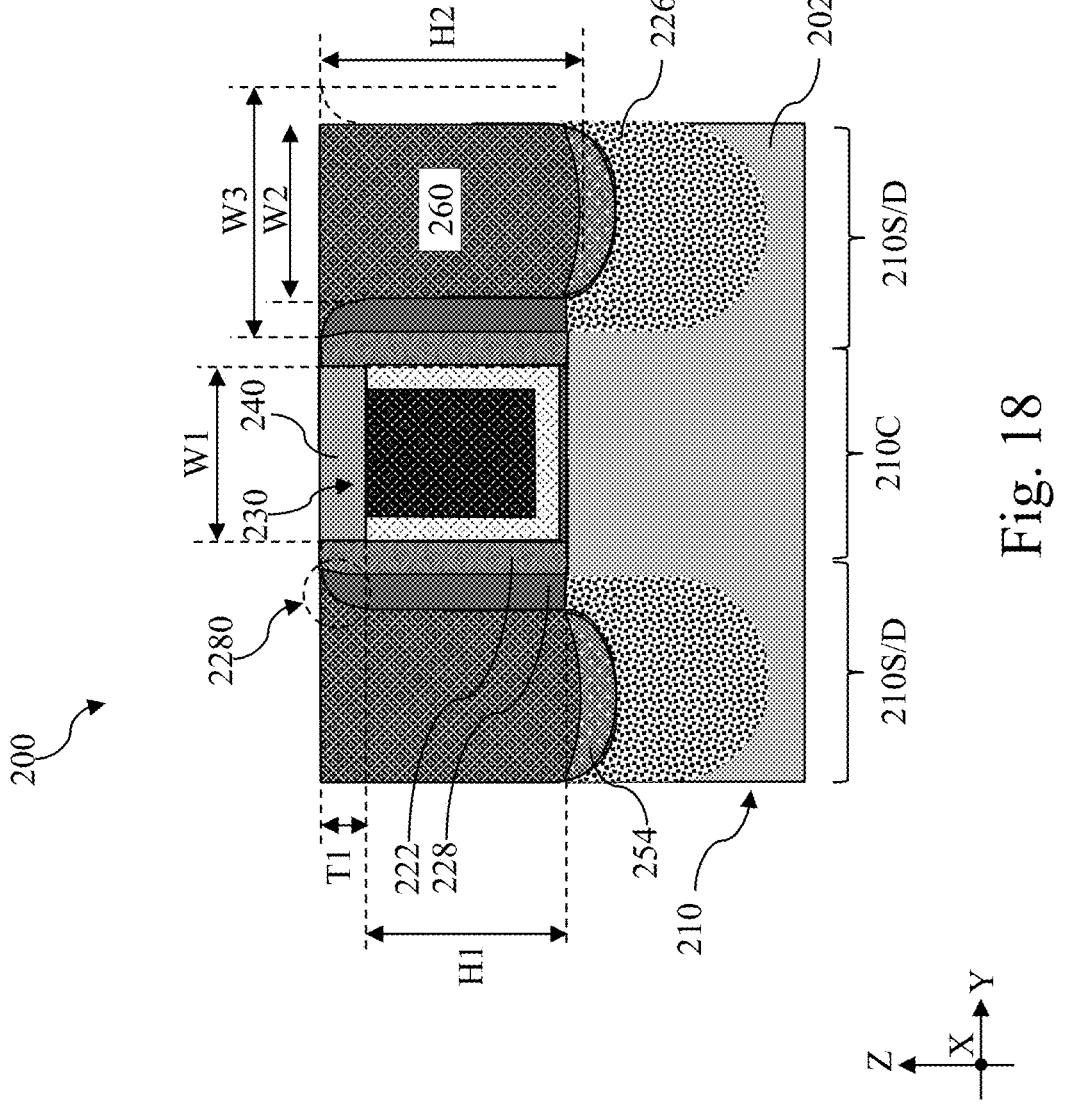

Dimensions of various structural features in FIG. 16 are illustrated in an enlarged view of the semiconductor device 200 in FIG. 18. As illustrated in FIG. 18, the gate structure 230 has a first height H1 along the Z direction, the source/drain feature 260 has a second height H2 along the Z direction, the dielectric cap 240 has a first thickness T1 along the Z direction, the dielectric cap 240 has a first width W1 along the Y direction, a lower portion of the source/drain feature 260 has a second width W2 along the Y direction, and an upper portion of the source/drain feature 260 has a third width W3 along the Y direction. In some instances, as measured from a top surface of the fin 210 in the channel region 210C, the first height H1 may be between about 4 nm and about 35 nm. The second height H2 may be between about 12 nm and about 50 nm. The first thickness T1 may be between about 6 nm and about 35 nm. The first width W1 may be similar to a gate length of the gate structure 230. A difference between the first width W1 and the gate length may be smaller than 2 nm. The third width W3 is greater than the second width W2 by between about 1 nm and about 8 nm. In some instances, a ratio of the third width W3 to the second width W2 may be between about 1.05 and about 1.6. The greater third width W3 may help widen the process window when it comes to landing of source/drain contact vias. In some instances, a ratio of the first height H1 to the first thickness T1 may be between about 0.3 and about 3. The first thickness T1 may not be smaller than 6 nm. When the first thickness T1 is smaller than 6 nm, the dielectric cap 240 may not provide sufficient protection to the work function layers in the gate structure 230, making it difficult to control the threshold voltage. When the first thickness T1 is greater than 35 nm, it may be too difficult to form gate contact vias through the dielectric cap 240. The rounded corners 2280 of the CESL 228 may be defined by a height dimension along the Z direction and a thickness dimension along the Y direction. A ratio of thickness dimension to the height dimension may be between about 0.2 and about 5.

In some alternative embodiments, operations at block 118 are performed such that the gate recess is less selective to the gate structure 230. The at least one gate spacer 222 and the CESL 228 are also etched and as a result, the gate recess 236 is wider than the gate length of the gate structure 230 along the Y direction.

Figure 19:
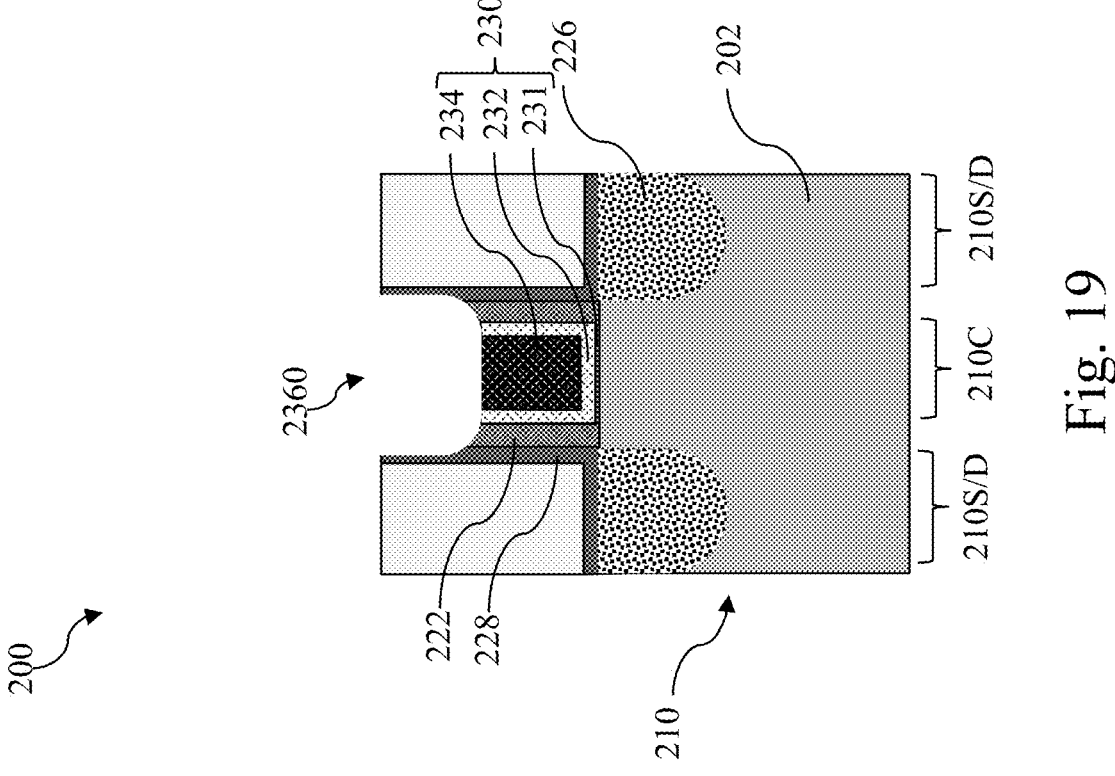
Figure 20:
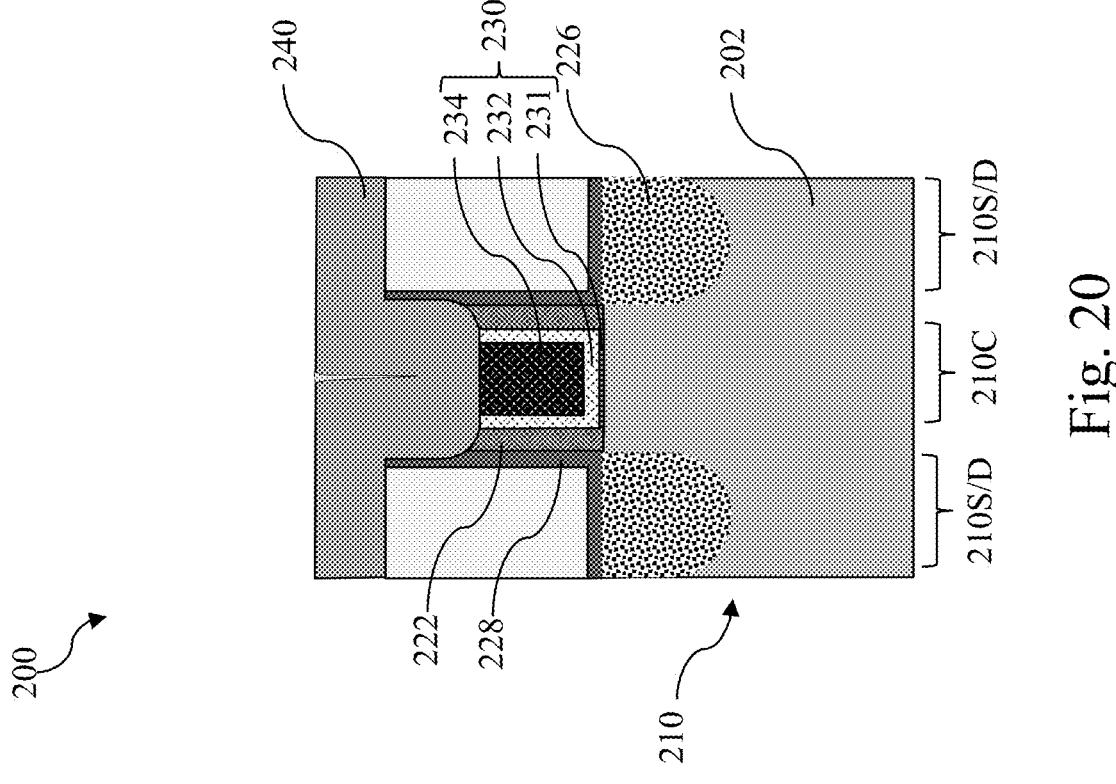
Figure 21:
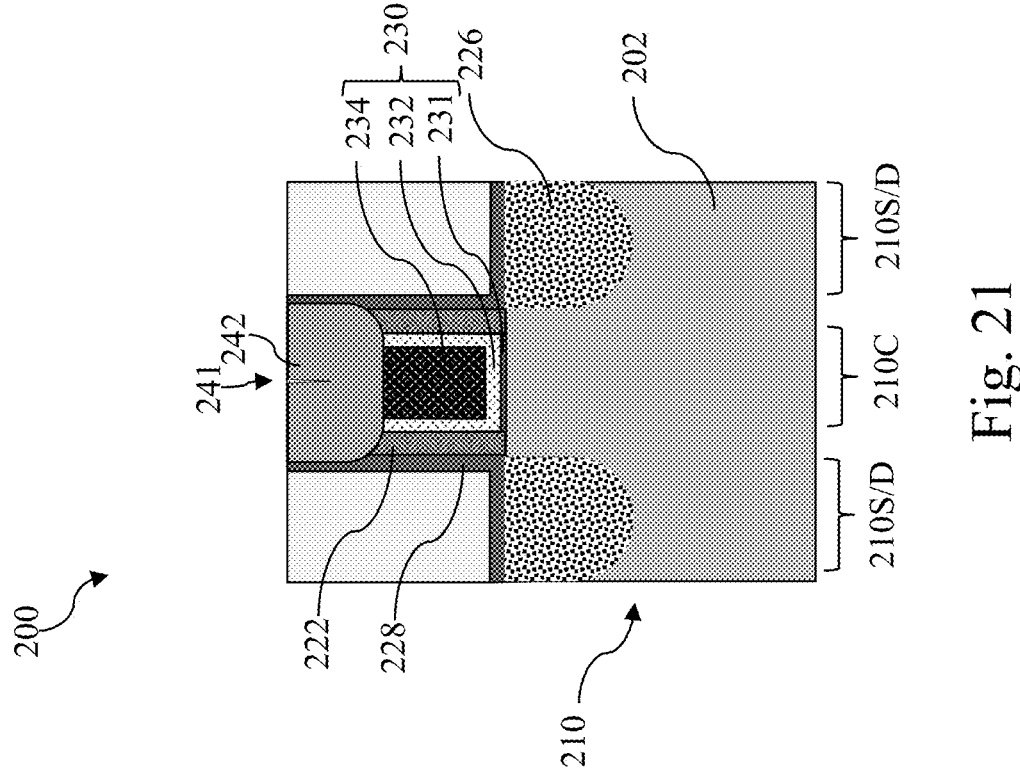
Figure 22:
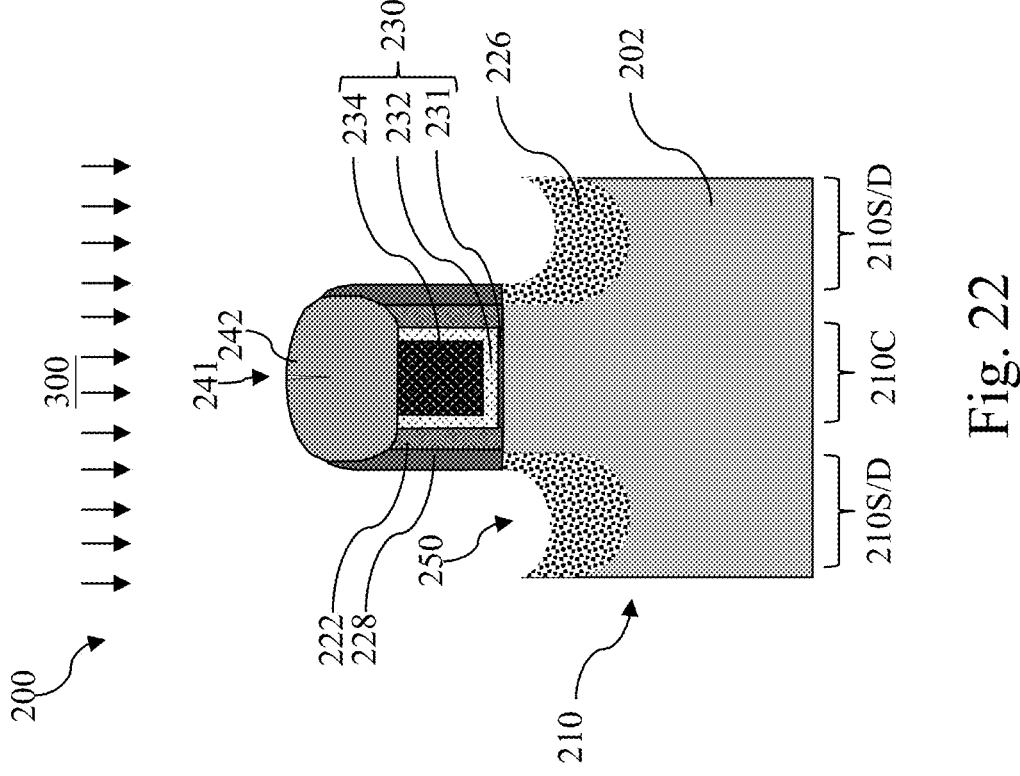
Figure 23:
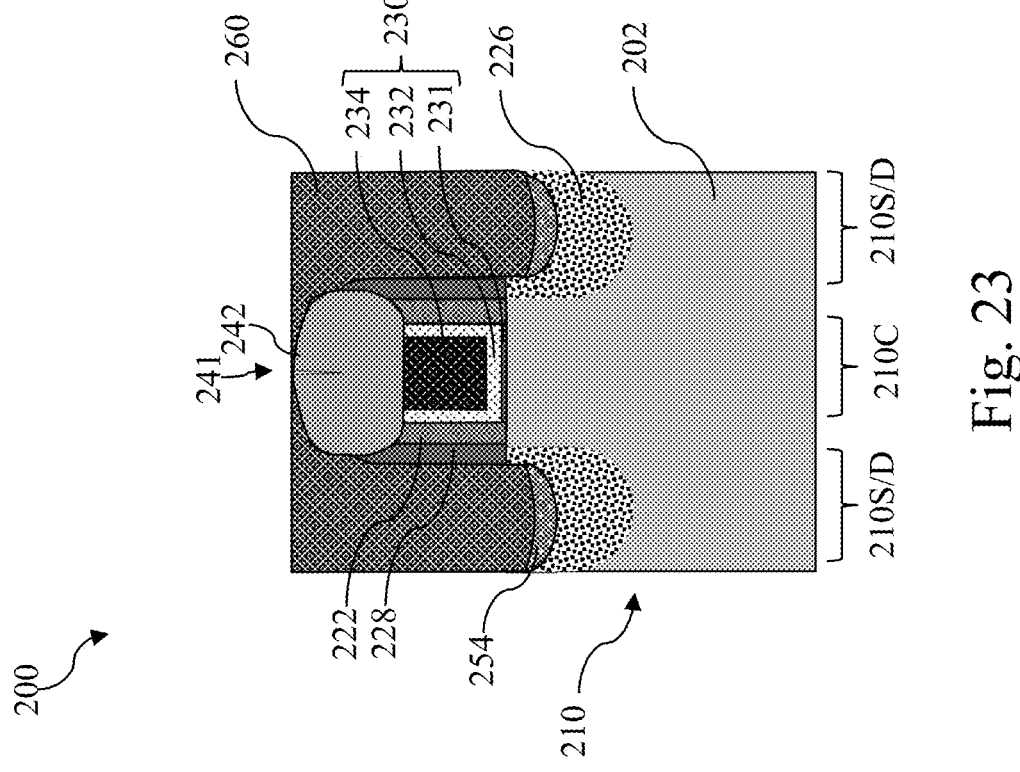
Figure 24:
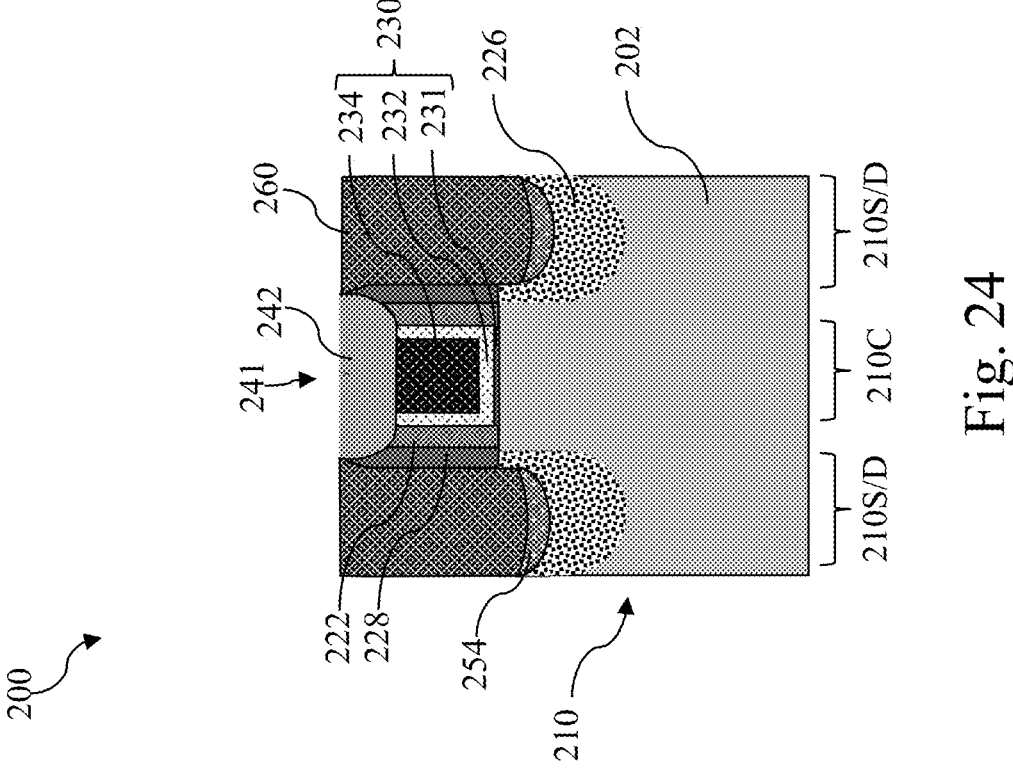

Referring to FIGS. 1 and 19, in some alternative embodiments, the recessing at block 118 of the method 100 also etches the at least one gate spacer layer 222 and at least a portion of the CESL 228. In the alternative embodiments, a resulted first wide gate recess 2360 expands along the Y direction into the CESL 228. In the embodiments represented in FIG. 19, the first wide gate recess 2360 is defined between portions of the CESL 228. Referring to FIGS. 1 and 20, block 120 of method 100 then deposits the capping dielectric layer 240 over the workpiece 200, including the first wide gate recess 2360. After the capping dielectric layer 240 is planarized at block 122 of method 100, the capping dielectric layer 240 in the first wide gate recess 2360 forms a first wide dielectric cap 242 shown in FIG. 21. The sidewalls of the first wide dielectric cap 242 are in direct contact with the CESL 228. Like the dielectric cap 240, the first wide dielectric cap 242 may also include a middle seam 241. As operations of method 100 proceed from block 122 to 124, the anisotropic etching forms a rounded profile that includes both the first wide dielectric cap 242 and the CESL 228, as shown in FIG. 22. Thereafter, block 126 forms source/drain contacts 260 over the source/drain features 226, where the source/drain contacts 260 track the rounded profile that includes the first wide dielectric cap 242 and the CESL 228, as illustrated in FIG. 23. At block 128, the workpiece 200 is planarized such that the top surfaces of the source/drain contacts 260 and the first wide dielectric cap 242 are coplanar, as shown in FIG. 24. It is noted that the first wide dielectric cap 242 is in direct contact with the CESL 228, the at least one gate spacer 222, the gate dielectric layer 232, and the gate electrode 234. In some embodiments represented in FIG. 24, a portion of the middle seam 241 may remain in the first wide dielectric cap 242. At block 130, the ESL 262 and the top ILD layer 264 are sequentially deposited over the coplanar surface of the source/drain contacts 260 and the first wide dielectric cap 242. Contact vias 266 are formed in the top ILD layer 264 and the ESL 262 to contact top surfaces of the source/drain contacts 260, as shown in FIG. 25.

Figure 26:
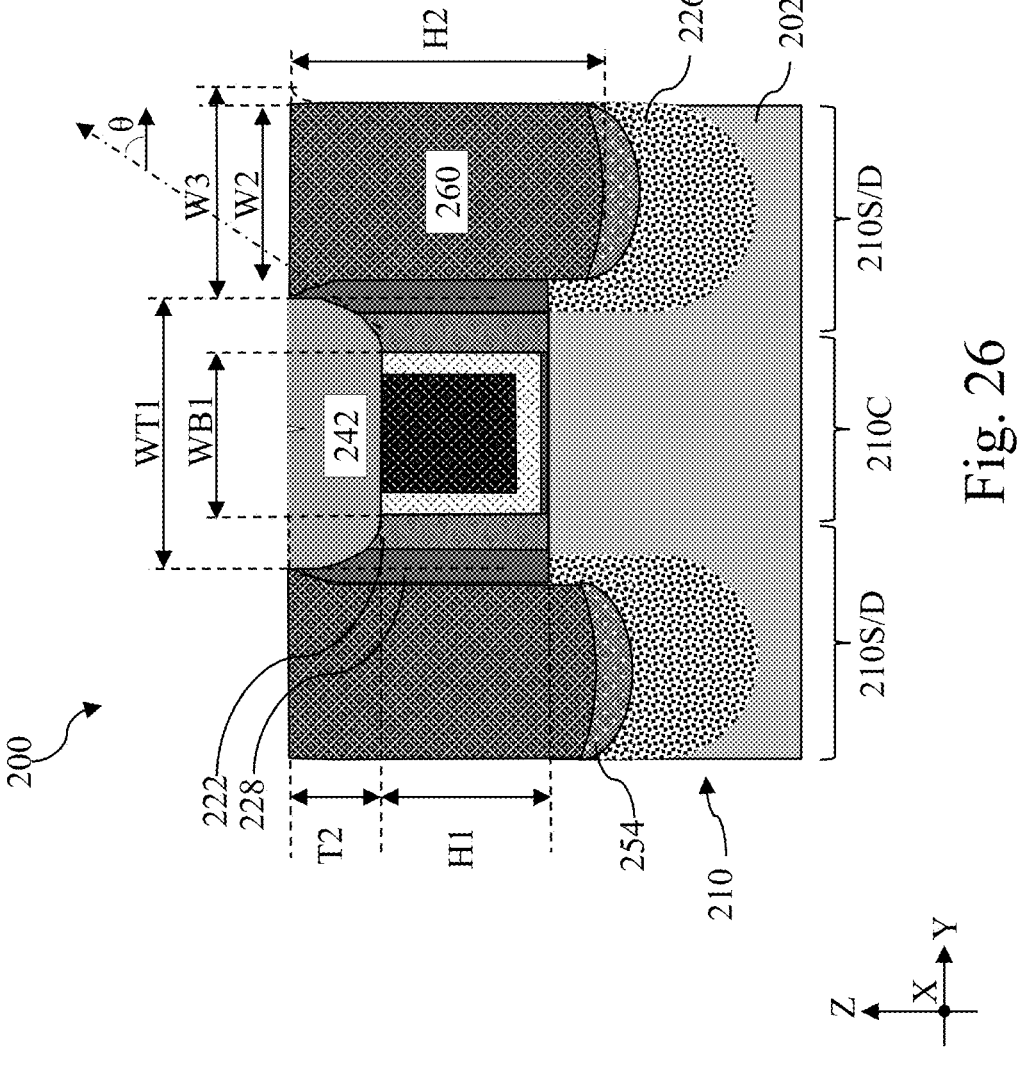

Dimensions of various structural features in FIG. 24 are illustrated in an enlarged view of the semiconductor device 200 in FIG. 26. As illustrated in FIG. 26, the gate structure 230 has a first height H1 along the Z direction, the source/drain feature 260 has a second height H2 along the Z direction, the first wide dielectric cap 242 has a second thickness T2 along the Z direction, the first wide dielectric cap 242 has a first bottom width WB1 along the Y direction and a first top width WT1 along the Y direction, a lower portion of the source/drain feature 260 has a second width W2 along the Y direction, and an upper portion of the source/drain feature 260 has a third width W3 along the Y direction. In some instances, as measured from a top surface of the fin 210 in the channel region 210C, the first height H1 may be between about 4 nm and about 35 nm. The second height H2 may be between about 12 nm and about 50 nm. The second thickness T2 may be between about 6 nm and about 35 nm. The first bottom width WB1 may be similar to a gate length of the gate structure 230. The first top width WT1 is greater than the first bottom width WB1. A difference between the first top width WT1 and the first bottom width WB1 may be between about 2 nm and about 20 nm. The first top width WT1 is, however, smaller than the sidewall-to-sidewall distance of the CESL 228 as the first wide gate recess 2360 is still defined within the boundaries of the CESL 228. The sidewall-to-sidewall distance of the CESL 228 along the Y direction may be greater than the first top width WT1 by between about 1 nm and about 20 nm.

The leftover CESL 228 thickness along the Y direction may be between about 0.5 nm and about 5 nm. The third width W3 is greater than the second width W2 by between about 1 nm and about 10 nm. The greater third width W3 may help widen the process window when it comes to landing of source/drain contact vias. In some instances, a ratio of the first top width WT1 to the first bottom width WB1 may be between about 1.05 and about 3. In some instances, a ratio of the first height H1 to the second thickness T2 may be between about 0.3 and about 3. The second thickness T2 may not be smaller than 6 nm. When the second thickness T2 is smaller than 6 nm, the first wide dielectric cap 242 may not provide sufficient protection to the work function layers in the gate structure 230, making it difficult to control the threshold voltage. When the second thickness T2 is greater than 35 nm, it may be too difficult to form gate contact vias through the first wide dielectric cap 242.

While the first wide dielectric cap 242 has a planar top surface as shown in FIG. 26, it has two rounded bottom corners. Each of the two rounded bottom corners is featured with a departure angle θ with respect to the horizontal direction. The departure angle θ may be between about 20° and about 75°. This departure angle θ is determined by an etch rate differential between an etch rate along the Z direction and an etch rate along the Y direction at block 118.

Figure 27:
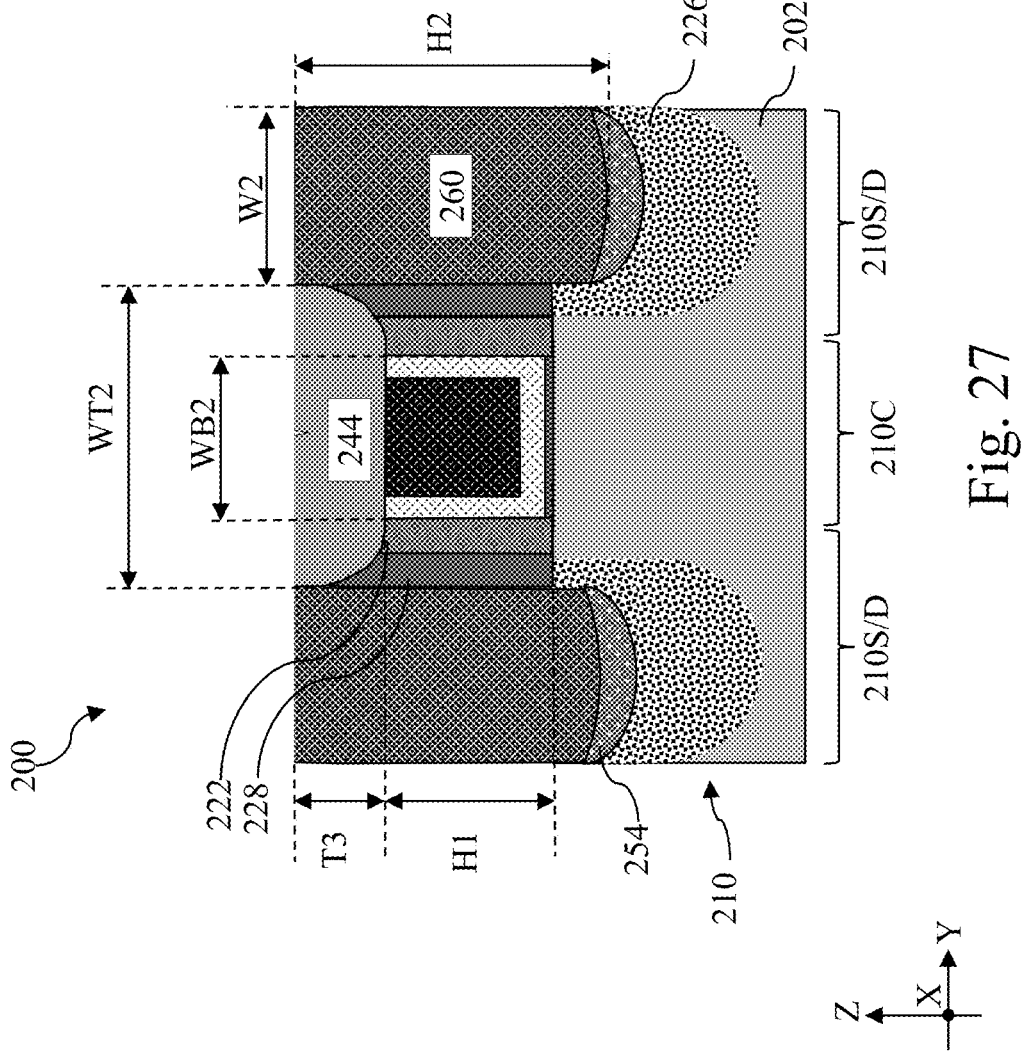
FIGS. 27 and 28 illustrate alternative semiconductor structures formed using the method in FIG. 1, according to various aspects of the present disclosure.

FIG. 27 illustrates another alternative embodiment where the recessing at block 118 pushes the gate recess boundaries all the way to the ILD layer 229. The resultant second wide dielectric cap 244 has a second bottom width WB2 and a second top width WT2. The second bottom width WB2 is substantially similar to a gate length of the gate structure 230 along the Y direction. The second top width WT2 is substantially similar to the distance between the outer sidewalls of the CESL 228. Because the second wide dielectric cap 244 pushes its boundaries all the way to the outer boundaries of the CESL 228, the source/drain feature 226 has a uniformed second width W2 throughout the second height H2. In some instances, as measured from a top surface of the fin 210 in the channel region 210C, the first height H1 may be between about 4 nm and about 35 nm. The second height H2 may be between about 12 nm and about 50 nm. The third thickness T3 may be between about 6 nm and about 35 nm. A difference between the second top width WT2 and the second bottom width WB2 may be between about 8 nm and about 20 nm. In some instances, a ratio of the first height H1 to the third thickness T3 may be between about 0.3 and about 3. The third thickness T3 may not be smaller than 6 nm. When the third thickness T3 is smaller than 6 nm, the second wide dielectric cap 244 may not provide sufficient protection to the work function layers in the gate structure 230, making it difficult to control the threshold voltage. When the third thickness T3 is greater than 35 nm, it may be too difficult to form gate contact vias through the second wide dielectric cap 244.

Figure 28:
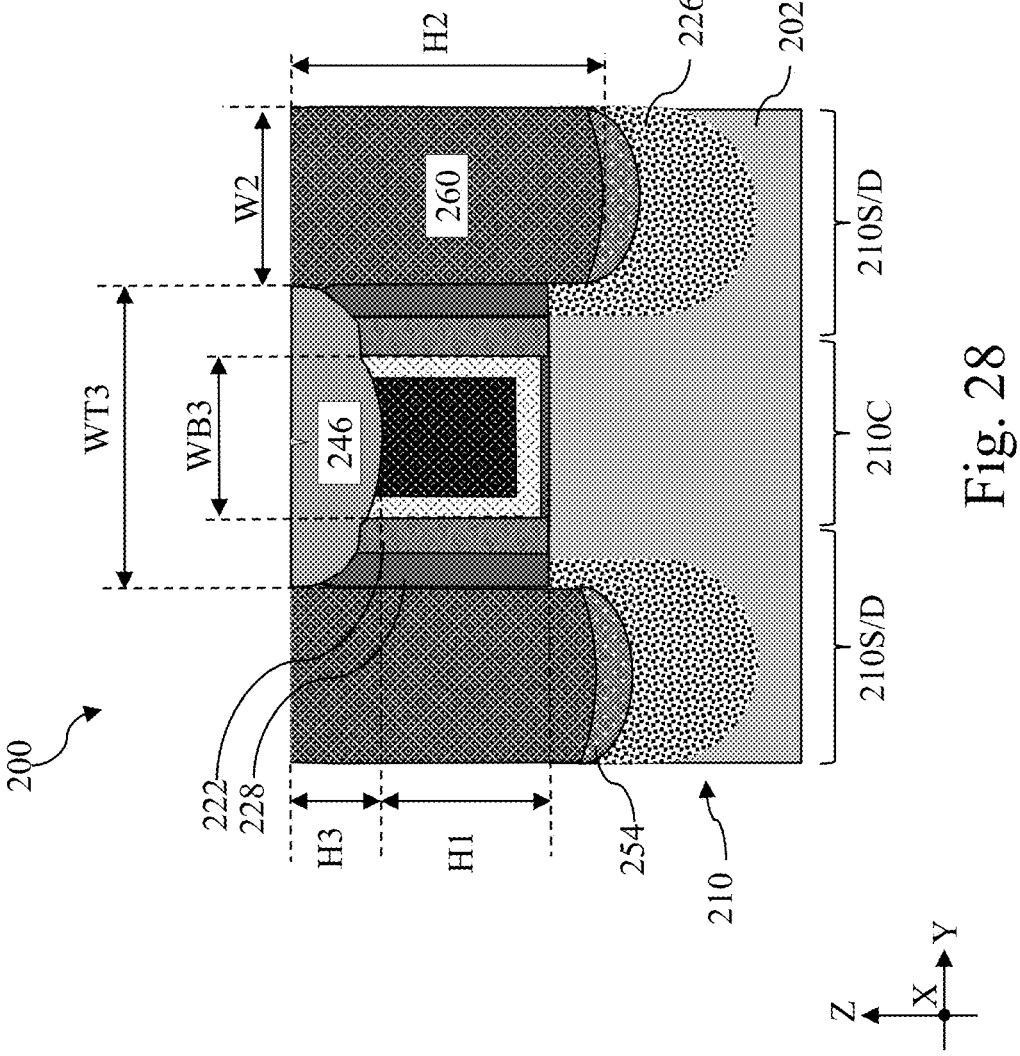

FIG. 28 illustrates yet another alternative embodiment where the recessing at block 118 etches the gate electrode layer 234 faster than the gate dielectric layer 232. The resultant third wide dielectric cap 246 may be similar to the second wide dielectric cap 244, except that a lower middle portion of the third wide dielectric cap 246 partially extends into the gate electrode layer 234. In other words, the lower middle portion partially extends between the two portions of the at least one gate spacer layer 222.

Figure 29:
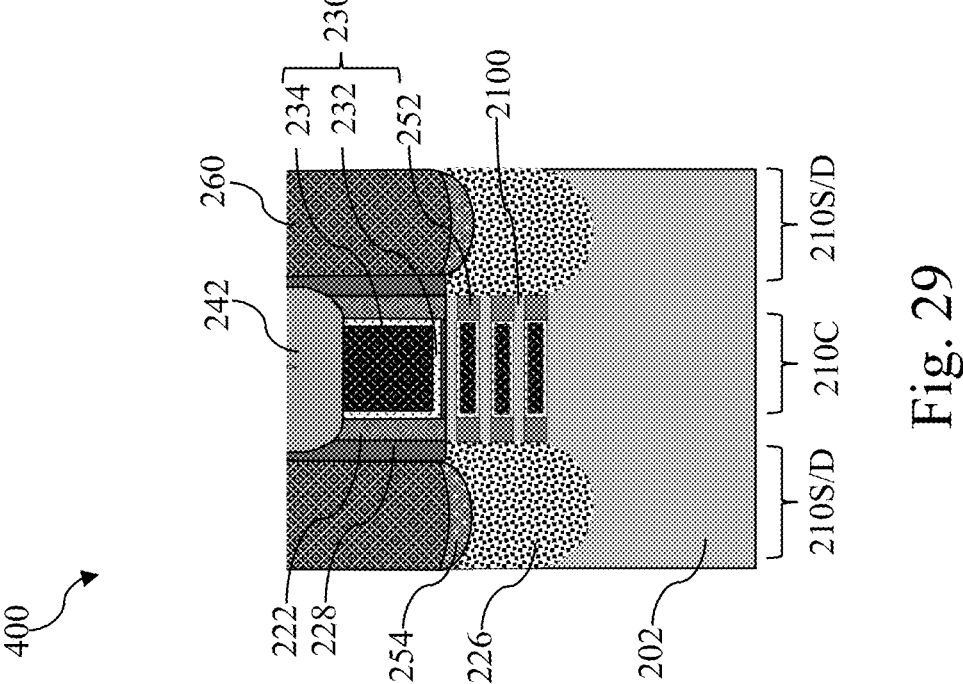
FIG. 29 illustrates MBC transistor structures formed using a method similar to the method in FIG. 1, according to various aspects of the present disclosure.

While different aspects of the present disclosure are described with reference to FinFET structures, they may also apply to other multi-gate structures, such as MBC transistor structures or fishbone transistor structures. FIG. 29 illustrates an MBC transistor 400 that includes a first wide dielectric cap 242 disposed over the gate structure 230. The MBC transistor 400 includes a plurality of sheet-like nanostructures 2100 disposed over a channel region 210C. The sheet-like nanostructures 2100 may also be referred to as nanosheets 2100. The sheet-like nanostructures 2100 are vertically stacked one over another along the Z direction. The gate structure 230, which includes an interfacial layer (not shown), a gate dielectric layer 232, and a gate electrode layer 234, wraps around each of the sheet-like nanostructures 2100. The sheet-like nanostructures 2100 are interleaved by a plurality of inner spacers 252. The plurality of inner spacers 252 space the gate structure 230 apart from the source/drain features 226. Each of the sheet-like nanostructures 2100 extend lengthwise along the Y direction between two source/drain features 226. A portion of the gate structure 230 above the topmost sheet-like nanostructure 2100 is disposed between and in contact with two portions of the at least one gate spacer layer 222. A CESL 228 is disposed along outer sidewalls of the at least one gate spacer layer 222. Similar to the first wide dielectric cap 242 shown in FIG. 26, the first wide dielectric cap 242 shown in FIG. 29 have sidewalls defined in and in contact with the CESL 228. Top surfaces of the first wide dielectric cap 242, the CESL 228, and the source/drain contact 260 are coplanar. Along the Y direction, a top width of the first wide dielectric cap 242 is greater than a bottom width of the first wide dielectric cap 242. It should be understood that the dielectric cap 240 (shown in FIG. 18), the second wide dielectric cap 244 (shown in FIG. 27) and the third wide dielectric cap 246 (shown in FIG. 28) may also be implemented in the MBC transistor 400 shown in FIG. 29.

The present disclosure provides for many different embodiments. In one embodiment, a semiconductor structure is provided. The semiconductor structure includes an active region having a channel region and a source/drain region, a gate structure over the channel region, a gate spacer layer disposed over the channel region and extending along a sidewall of the gate structure, an epitaxial source/drain feature over the source/drain region, a contact etch stop layer (CESL) disposed on the epitaxial source/drain feature and extending along a sidewall of the gate spacer layer, a source/drain contact disposed over the epitaxial source/drain feature, and a dielectric cap layer disposed over the gate structure, the gate spacer layer and at least a portion of the CESL. A sidewall of the source/drain contact is in direct contact with a sidewall of the CESL.

In some embodiments, the active region includes a fin structure and the gate structure wraps over the fin structure. In some implementations, the active region includes a vertical stack of nanostructures and the gate structure wraps around each of nanostructures. In some embodiments, top surfaces of the dielectric cap layer, the source/drain contact, and the CESL are coplanar. In some instances, the dielectric cap layer includes a dielectric constant between about 3.9 and about 10. In some embodiments, the dielectric cap layer includes silicon nitride, silicon carbonitride, silicon oxycarbonitride, silicon oxycarbide, aluminum oxide, zirconium silicate, or hafnium silicate. In some embodiments, a dielectric constant of the dielectric cap layer is greater than a dielectric constant of the gate spacer layer. In some embodiments, a dielectric constant of the dielectric cap layer is greater than a dielectric constant of the CESL. In some implementations, the active region extends lengthwise along a direction, the dielectric cap layer includes a top width along the direction and a bottom width along the direction, and the top width is greater than the bottom width. In some instances, the dielectric cap layer includes a curved sidewall such that a top portion of the curved sidewall is contact with the CESL and a bottom portion of the curved sidewall is contact with the gate spacer layer.

In another embodiment, a semiconductor structure is provided. The semiconductor structure includes a metal gate structure extending length width along a first direction, a pair of gate spacer layers sandwiching the metal gate structure along a second direction perpendicular to the first direction, a pair of contact etch stop layers sandwiching the pair of gate spacer layers along the second direction, and a dielectric cap disposed over the metal gate structure, the pair of gate spacer layers, and at least a part of the pair of contact etch stop layers. The dielectric cap includes a top width along the second direction and a bottom width along the second direction and the top width is greater than the bottom width.

In some embodiments, the dielectric cap includes a curved sidewall such that a top portion of the curved sidewall is contact with the pair of contact etch stop layers and a bottom portion of the curved sidewall is contact with the pair of gate spacer layers. In some implementations, top surfaces of the metal gate structure and the dielectric cap are coplanar. In some implementations, the dielectric cap includes a dielectric constant between about 3.9 and about 10. In some embodiments, the dielectric cap includes silicon nitride, silicon carbonitride, silicon oxycarbonitride, silicon oxycarbide, aluminum oxide, zirconium silicate, or hafnium silicate. In some implementations, a portion of the dielectric cap extends into the metal gate structure.

In yet another embodiment, a method is provided. The method includes forming a semiconductor element over a substrate, the semiconductor element including a channel region and a source/drain region, forming a dummy gate stack over the channel region of the semiconductor element, depositing a spacer layer over sidewalls of the dummy gate stack, after the depositing of the spacer layer, etching the source/drain region of the semiconductor element to form a source/drain recess, forming a source/drain feature in the source/drain recess, depositing a contact etch stop layer (CESL) over sidewalls of the spacer layer and the source/drain feature, depositing an interlayer dielectric (ILD) layer over the CESL, performing a first planarization to expose the dummy gate stack, replacing the dummy gate stack with a metal gate structure, recessing the metal gate structure to form a recess, depositing a dielectric layer over the recess, performing a second planarization to expose the ILD layer, anisotropically etching the source/drain feature, the CESL, the spacer layer, and the dielectric layer to form a contact opening, depositing a metal layer over the contact opening to form a source/drain contact, and performing a third planarization such that the source/drain contact, the CESL and the dielectric layer are coplanar.

In some embodiments, the dielectric layer includes a dielectric constant between about 3.9 and about 10. In some implementations, the dielectric layer includes silicon nitride, silicon carbonitride, silicon oxycarbonitride, silicon oxycarbide, aluminum oxide, zirconium silicate, or hafnium silicate. In some instances, the recessing also recesses the spacer layer and the CESL and, after the third planarization, the dielectric layer includes a curved sidewall such that a top portion of the curved sidewall is contact with the CESL and a bottom portion of the curved sidewall is contact with the spacer layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   an active region comprising a channel region and a source/drain region;
   a gate structure over the channel region;
   a gate spacer layer disposed over the channel region and extending along a sidewall of the gate structure;
   an epitaxial source/drain feature over the source/drain region;
   a contact etch stop layer (CESL) disposed on the epitaxial source/drain feature and extending along a sidewall of the gate spacer layer;
   a source/drain contact disposed over the epitaxial source/drain feature; and
   a dielectric cap layer disposed over the gate structure, the gate spacer layer and at least a portion of the CESL,
   wherein a sidewall of the source/drain contact is in direct contact with a sidewall of the CESL,
   wherein a top portion of the dielectric cap layer interfaces a sidewall of the source/drain contact.

2. The semiconductor structure of claim 1, wherein the active region comprises a fin structure and the gate structure wraps over the fin structure.

3. The semiconductor structure of claim 1, wherein the active region comprises a vertical stack of nanostructures and the gate structure wraps around each of nanostructures.

4. The semiconductor structure of claim 1, wherein top surfaces of the dielectric cap layer, the source/drain contact, and the CESL are coplanar.

5. The semiconductor structure of claim 1, wherein the dielectric cap layer comprises a dielectric constant between about 3.9 and about 10.

6. The semiconductor structure of claim 1, wherein the dielectric cap layer comprises silicon nitride, silicon carbonitride, silicon oxycarbonitride, silicon oxycarbide, aluminum oxide, zirconium silicate, or hafnium silicate.

7. The semiconductor structure of claim 1, wherein a dielectric constant of the dielectric cap layer is greater than a dielectric constant of the gate spacer layer.

8. The semiconductor structure of claim 1, wherein a dielectric constant of the dielectric cap layer is greater than a dielectric constant of the CESL.

9. The semiconductor structure of claim 1,
   wherein the active region extends lengthwise along a direction,
   wherein the dielectric cap layer comprises a top width along the direction and a bottom width along the direction,
   wherein the top width is greater than the bottom width.

10. The semiconductor structure of claim 9, wherein the dielectric cap layer comprises a curved sidewall such that a top portion of the sidewall is contact with the CESL and a bottom portion of the sidewall is contact with the gate spacer layer.

11. A semiconductor structure, comprising:
    a metal gate structure extending length width along a first direction;

a pair of gate spacer layers sandwiching the metal gate structure along a second direction perpendicular to the first direction;

a pair of contact etch stop layers sandwiching the pair of gate spacer layers along the second direction; and a dielectric cap disposed over the metal gate structure, the pair of gate spacer layers, and at least a part of the pair of contact etch stop layers, wherein the dielectric cap comprises a top width along the second direction and a bottom width along the second direction, wherein the top width is greater than the bottom width, wherein a portion of the dielectric cap extends into the metal gate structure.

12. The semiconductor structure of claim 11, wherein the dielectric cap comprises a curved sidewall such that a top portion of the curved sidewall is contact with the pair of contact etch stop layers and a bottom portion of the curved sidewall is contact with the pair of gate spacer layers.

13. The semiconductor structure of claim 11, wherein top surfaces of the metal gate structure and the dielectric cap are coplanar.

14. The semiconductor structure of claim 11, wherein the dielectric cap comprises a dielectric constant between about 3.9 and about 10.

15. The semiconductor structure of claim 11, wherein the dielectric cap comprises silicon nitride, silicon carbonitride, silicon oxycarbonitride, silicon oxycarbide, aluminum oxide, zirconium silicate, or hafnium silicate.

16. The semiconductor structure of claim 11, wherein the top width is greater than a distance between the pair of contact etch stop layers.

17. A method, comprising:

forming a semiconductor element over a substrate, the semiconductor element including a channel region and a source/drain region;

forming a dummy gate stack over the channel region of the semiconductor element;

depositing a spacer layer over sidewalls of the dummy gate stack;

after the depositing of the spacer layer, etching the source/drain region of the semiconductor element to form a source/drain recess;

forming a source/drain feature in the source/drain recess;

depositing a contact etch stop layer (CESL) over sidewalls of the spacer layer and the source/drain feature;

depositing an interlayer dielectric (ILD) layer over the CESL;

performing a first planarization to expose the dummy gate stack;

replacing the dummy gate stack with a metal gate structure;

recessing the metal gate structure to form a recess;

depositing a dielectric layer over the recess;

performing a second planarization to expose the ILD layer;

anisotropically etching the source/drain feature, the CESL, the spacer layer, and the dielectric layer to form a contact opening;

depositing a metal layer over the contact opening to form a source/drain contact; and performing a third planarization such that the source/drain contact, the CESL and the dielectric layer are coplanar.

18. The method of claim 17, wherein the dielectric layer comprises a dielectric constant between about 3.9 and about 10.

19. The method of claim 17, wherein the dielectric layer comprises silicon nitride, silicon carbonitride, silicon oxycarbonitride, silicon oxycarbide, aluminum oxide, zirconium silicate, or hafnium silicate.

20. The method of claim 17, wherein the recessing also recesses the spacer layer and the CESL, wherein, after the third planarization, the dielectric layer comprises a curved sidewall such that a top portion of the curved sidewall is contact with the CESL and a bottom portion of the curved sidewall is contact with the spacer layer.

* * * * *